US006861650B2

(12) United States Patent
Kondo et al.

(10) Patent No.: US 6,861,650 B2
(45) Date of Patent: Mar. 1, 2005

(54) ELECTRON BEAM DETECTOR, SCANNING TYPE ELECTRON MICROSCOPE, MASS SPECTROMETER, AND ION DETECTOR

(75) Inventors: Minoru Kondo, Hamamatsu (JP); Toshimitsu Nagai, Hamamatsu (JP); Atsushi Kibune, Hamamatsu (JP)

(73) Assignee: Hamamatsu Photonics K.K., Hamamatsu (JP)

( * ) Notice: Subject to any disclaimer, the term of this patent is extended or adjusted under 35 U.S.C. 154(b) by 0 days.

(21) Appl. No.: 10/470,847

(22) PCT Filed: Jan. 30, 2002

(86) PCT No.: PCT/JP02/00726

§ 371 (c)(1),
(2), (4) Date: Aug. 27, 2003

(87) PCT Pub. No.: WO02/061458

PCT Pub. Date: Aug. 8, 2002

(65) Prior Publication Data

US 2004/0061054 A1 Apr. 1, 2004

(30) Foreign Application Priority Data

Jan. 31, 2001 (JP) ........................... 2001-024421

(51) Int. Cl.[7] ................ G03G 15/00; G01N 23/00; G21K 7/00; G01K 1/42; H01L 31/113
(52) U.S. Cl. ............... 250/315.3; 250/310; 250/311; 250/372; 250/399; 250/370.11; 257/290; 257/77
(58) Field of Search ............... 250/315.3, 370.11, 250/310, 311, 586, 397, 372, 399; 257/290, 77

(56) References Cited

U.S. PATENT DOCUMENTS 3,894,233 A * 7/1975 Tamura et al. ............... 250/307
5,051,977 A 9/1991 Goldberg
5,146,296 A * 9/1992 Huth ........................... 257/429
5,461,226 A * 10/1995 Nicoli et al. ............ 250/214 VT
6,486,476 B1 * 11/2002 Ochiai et al. ........... 250/370.01
6,781,133 B2 * 8/2004 Karplus et al. ........... 250/370.1
2002/0074553 A1 * 6/2002 Starikov et al. .............. 257/77
2004/0056279 A1 * 3/2004 Niigaki et al. .............. 257/202

FOREIGN PATENT DOCUMENTS

| JP | A 53-124498 | 10/1978 |
|---|---|---|
| JP | A 54-18269 | 2/1979 |
| JP | A 03-100945 | 4/1991 |
| JP | A 04-250646 | 9/1992 |
| JP | A 5-264738 | 10/1993 |
| JP | A 5-308149 | 11/1993 |
| JP | A 6-11572 | 1/1994 |
| JP | A 06-280014 | 10/1994 |
| JP | A 10-160853 | 6/1998 |
| JP | A 11-339681 | 12/1999 |
| JP | A 2000-8035 | 1/2000 |
| JP | A 2000-249768 | 9/2000 |
| JP | A 2000-253320 | 9/2000 |

* cited by examiner

Primary Examiner—John R. Lee
Assistant Examiner—Kalimah Fernandez
(74) Attorney, Agent, or Firm—Oliff & Berridge, PLC

(57) ABSTRACT

In an electron beam detector, a light guide optically couples a fluorescence emitting surface of the compound semiconductor substrate to a light incident surface of the photodetector, and physically connects the compound semiconductor substrate with the photodetector, thereby integrating the compound semiconductor substrate with the photodetector. When the compound semiconductor substrate converts incident electrons to fluorescent light, the light guide guides the fluorescent light to the photodetector, and the photodetector detects the fluorescent light, thereby detecting the incident electrons.

26 Claims, 14 Drawing Sheets

ELECTRON BEAM DETECTOR, SCANNING TYPE ELECTRON MICROSCOPE, MASS SPECTROMETER, AND ION DETECTOR

TECHNICAL FIELD

The present invention relates to an electron beam detector, a scanning type electron microscope, a mass spectrometer, and an ion detector.

BACKGROUND ART

Conventional electron beam detectors measures the value of the current flow generated by the electron beam in order to measure high-intensity electron beams.

However, an electron beam detector employed in a scanning type electron microscope, for example, produces little electric charge when the intensity of the electron beam is relatively weak. Therefore, secondary electrons generated from the surface of a sample irradiated by an electron beam are collected and irradiated onto a fluorescent material. A photomultiplier tube is used to measure the fluorescence emitted by the fluorescent material.

Fluorescent materials well known in the art include $CaF_2$, $CaP_5O_{14}$, P47, P46, YAG: $Ce^{3+}$, YAP: $Ce^{3+}$ (polycrystalline), and YAP: $Ce^{3+}$ (single-crystal). However, a sufficient response has not been achieved with any of these fluorescent materials.

DISCLOSURE OF THE INVENTION

In view of the foregoing, it is an object of the present invention to provide an electron beam detector capable of obtaining sufficient response characteristics. Another object of the present invention is to provide a scanning type electron microscope, a mass spectrometer, and an ion detector employing the above electron beam detector.

An electron beam detector includes: a compound semiconductor substrate having an electron beam incident surface and a fluorescence emitting surface, the compound semiconductor substrate converting electrons incident on the electron beam incident surface into fluorescent light to emit the fluorescent light from the fluorescence emitting surface; a photodetector; and connecting means for optically coupling the fluorescence emitting surface of the compound semiconductor substrate with a light incident surface of the photodetector and physically connecting the compound semiconductor substrate with the photodetector, thereby integrating the compound semiconductor substrate and photodetector. The connecting means conducts fluorescent light generated by the compound semiconductor substrate in response to an incident electron beam to the photodetector, and the photodetector detects the fluorescent light.

Compound semiconductors such as Group III-V or Group II-VI compound semiconductors emit fluorescence when irradiated to an electron beam. The inventors of the present invention discovered that these compound semiconductors have a very high response when generating fluorescence in response to an incident electron beam, that is, the lifetime of the fluorescence generated in response to the incident electron beam is very short. In the electron beam detector of the present invention, the connecting means optically couples the fluorescence emitting surface of the compound semiconductor substrate with the light incident surface of the photodetector, and physically connects the compound semiconductor substrate with the photodetector, thereby integrating the compound semiconductor substrate and photodetector. When fluorescent light is generated in response to an incident electron beam on the compound semiconductor substrate and emitted from the fluorescence emitting surface, the connecting means guides the fluorescent light to the photodetector. The photodetector detects the fluorescent light to detect the incident electron beam. Since the compound semiconductor substrate is optically coupled with the light incident surface of the photodetector to be integrated therewith, the electron beam detector of the present invention has sufficient response. Hence, the electron beam detector of the present invention can be used in a scanning type electron microscope and a mass spectrometer.

Here, the fluorescence emitting surface of the compound semiconductor substrate is preferably formed on the side opposite to the electron beam incident surface, because both the electron incident region and fluorescence emitting region can be effectively provided.

It is preferable that the compound semiconductor substrate includes: a compound semiconductor substrate layer; and a compound semiconductor light emitting layer formed on the compound semiconductor substrate layer through a heterojunction, and formed of a compound semiconductor single crystal for converting an incident electron into fluorescence.

The compound semiconductor substrate having the above construction is reliably connected to the photodetector by the connecting means.

The compound semiconductor substrate layer is preferably formed of a Group III-V or a Group II-VI compound semiconductor. It is preferable that the compound semiconductor light emitting layer is formed of at least one material of the group consisting of GaAs, GaAsP, GaN, GaAlN, GaInN, ZnS, and ZnSe. The compound semiconductor light emitting layer formed of the above material generates fluorescence quickly in response to an incident electron beam and, moreover, exhibits a quick response. Especially, the compound semiconductor light emitting layer is preferably formed of a GaAsP layer, and the compound semiconductor substrate layer is formed of an AlGaAsP layer. A compound semiconductor substrate having the above construction can achieve a very high response. The compound semiconductor light emitting layer may be formed of a GaAs layer and the compound semiconductor substrate layer is formed of an AlGaAs layer. The electron beam detector exhibits a quick response.

It is preferable that the compound semiconductor substrate layer has the fluorescence emitting surface, and the fluorescence emitting surface is connected to the photodetector through the connecting means. The compound semiconductor substrate layer is provided between the compound semiconductor light emitting layer and the connecting means, which prevents the compound semiconductor light emitting layer from being contaminated by the connecting means.

The compound semiconductor substrate can also be provided with a compound semiconductor coating layer formed on the compound semiconductor light emitting layer. In this case, the compound semiconductor coating layer includes the electron beam incident surface. However, this coating layer may be eliminated. Without the coating layer, the light emitting layer may include the electron beam incident surface.

An electron beam detector of the present invention preferably includes a metal layer on the electron beam incident surface of the compound semiconductor substrate. For example, when the compound semiconductor substrate has a coating layer, a metal layer can be provided over the coating layer. However, when the compound semiconductor substrate does not have a compound semiconductor coating layer, the metal layer can be provided on the compound semiconductor light emitting layer. If a positive voltage is applied to the metal layer, an electron beam can be irradiated onto the electron beam incident surface of the compound semiconductor substrate. The metal layer functions to suppress charge-up in the compound semiconductor substrate and to reflect fluorescent light to the photodetector.

Instead of providing a metal layer on the electron beam incident surface of the compound semiconductor substrate, the electron beam incident surface of the compound semiconductor substrate may be exposed. In this case, it is possible to suppress charge-up in the compound semiconductor substrate if the carrier concentration of the electron beam incident surface is set to be equal to or more than to $1 \times 10^{19}$ cm$^{-3}$. When the compound semiconductor substrate does not have a compound semiconductor coating layer, for example, charge-up in the compound semiconductor substrate can be suppressed by setting the carrier concentration in the entire compound semiconductor light emitting layer or in a surface layer including the exposed surface to be equal to or more than $1 \times 10^{19}$ cm$^{-3}$.

It is preferable that the connecting means is formed of a fluorescent light transmissive adhesive layer. Accordingly, the compound semiconductor substrate can be reliably connected to the photodetector, and fluorescence generated by the compound semiconductor substrate can be reliably guided to the photodetector.

Alternatively, the connecting means may be formed of an optical member formed of a fluorescent light transmissive material. The fluorescence emitting surface of the compound semiconductor substrate is mounted on one end face of the optical member, and the other end face of the optical member is mounted on the light incident surface of the photodetector. Accordingly, the compound semiconductor substrate can be reliably connected to the photodetector through the optical member, and fluorescence generated by the compound semiconductor substrate can be reliably transmitted to the photodetector. In this case, it is preferable that the optical member is formed of glass, and the connecting means further includes: a SiN layer formed on the fluorescence emitting surface of the compound semiconductor substrate; and a SiO$_2$ layer formed on the SiN layer. The optical member can be reliably connected to the compound semiconductor substrate, because the SiO$_2$ layer is fused to the glass. In addition, the SiN layer and the SiO$_2$ layer can reliably guide the fluorescence to the optical member. Moreover, the SiN layer functions as a reflection-preventing film. If the connecting means further includes a fluorescent light transmissive adhesive layer for fixing the optical member of glass to the light incident surface of the photodetector, it is possible to reliably connect the optical member to the photodetector and to reliably transmit fluorescence transmitted by the optical member to the photodetector.

An electron beam detector of the present invention may further include an electron multiplying section disposed at a position facing the electron beam incident surface of the compound semiconductor substrate, wherein an electron beam multiplied by the electron multiplying section is impinged on the electron beam incident surface. With this construction, it is possible to detect a weak intensity electron beam with high accuracy. It is preferable that the electron multiplying section is a microchannel plate. The microchannel plate is capable of multiplying weak intensity electron beams. Further, the microchannel plate can detect ions as well as electron beams.

Preferably, the photodetector is a photomultiplier tube, and the fluorescence emitting surface of the compound semiconductor substrate is connected to a light incident window of the photomultiplier tube through the connecting means. By using a photomultiplier tube, it is possible to detect weak intensity electron beams with good accuracy. In this case, the photomultiplier tube preferably includes: a wall section forming a vacuum space with the light incident window, a photocathode formed in the vacuum space on an inner surface of the light incident window, and an electron multiplying section and an anode formed in the vacuum space. The photocathode generates electrons in response to incident fluorescence from the compound semiconductor substrate, the electron multiplying section multiplies the electrons, and the anode collects the multiplied electrons. The photocathode, the electron multiplying section, and the anode are not exposed to the atmosphere, even when the electron beam detector is removed from the vacuum chamber used for detecting electron beams, since they are formed inside the vacuum space. Accordingly, it is possible to use the electron beam detector for different applications, while preventing the deterioration of these components. It is preferable that the electron multiplying section includes a plurality of stacked dynodes. The above stacked-type electron multiplying section exhibits a quick response. Therefore, electron multiplying section can detect electron beams with very quick response when integrated with the highly responsive compound semiconductor substrate.

Alternatively, the photodetector may include an avalanche photodiode. In this case, the fluorescence emitting surface of the compound semiconductor substrate is connected to the light incident surface of the photodetector through the connecting means. By using the avalanche photodiode described above, it is possible to detect weak intensity electron beams with good accuracy. It is preferable that the connecting means guides fluorescence to the light incident surface of the photodetector, tapering an output surface thereof, when the light incident surface of the photodetector is smaller than the fluorescence emitting surface of the compound semiconductor substrate. In this case, the connecting means includes a light guide. The light guide preferably has a fluorescence input surface connected to the fluorescence emitting surface of the compound semiconductor substrate, and a fluorescence output surface connected to the light incident surface of the photodetector, the fluorescence output surface being smaller than the fluorescence input surface. Since an avalanche photodiode having a small light incident surface and exhibiting quick good response can be used, it is possible to detect electron beams with good response. Moreover, since the fluorescent light is transmitted while reducing the fluorescence output surface area, it is possible to use a compound semiconductor substrate having a large surface area. Therefore, an electron beam can be received in a large surface area and detected on a one-time basis, which improves the detection accuracy of the photodetector.

From another aspect of the present invention, a scanning type electron microscope of the present invention includes a wall section constructing a vacuum chamber, an electron beam scanning section for scanning a surface of a sample disposed in the vacuum chamber using an electron beam, and an electron beam detector. The electron beam detector includes a compound semiconductor substrate having an electron beam incident surface and a fluorescence emitting surface, the compound semiconductor substrate converting electrons incident on the electron beam incident surface into fluorescent light to emit the fluorescent light from the fluorescence emitting surface, a photodetector, and connecting means for optically coupling the fluorescence emitting surface of the compound semiconductor substrate with a light incident surface of the photodetector and physically connecting the compound semiconductor substrate with the photodetector, thereby integrating the compound semiconductor substrate and photodetector. Therefore, the connecting means guides fluorescent light generated by the compound semiconductor substrate in response to an incident electron beam to the photodetector, and the photodetector detects the fluorescent light. The electron beam detector is mounted on the wall section such that at least the electron beam incident surface of the compound semiconductor substrate is positioned within the vacuum chamber. The electron scanning section scans the surface of the sample with the electron beam to induce the generation of secondary electrons, and an application of a predetermined voltage to the compound semiconductor substrate guides the generated secondary electrons to the electron beam detector. Therefore, the electron beam detector detects the generated secondary electrons.

With the scanning type electron microscope of the present invention having the above construction, the electron beam detector is, for example, detachably mounted on the wall section of the vacuum chamber, such that at least the electron beam incident surface of the compound semiconductor substrate is positioned within the vacuum chamber. A sample is disposed in the vacuum chamber. And the electron beam scanning section including, for example, an electron gun and a deflection plate scans a surface of the sample with an electron beam. A potential difference relative to the sample is applied to the compound semiconductor substrate in the electron beam detector. When the electron scanning section scans the surface of the sample with an electron beam, the sample generates secondary electrons. The secondary electrons are guided to and then detected by the electron beam detector. Since the electron beam detector in this scanning type electron microscope has good response, it is possible to produce images with good contrast and to improve the scanning rate. It is also preferable to use a special or general purpose control device to apply a voltage to the electron beam detector, create an image of the sample by correlating the output of the electron beam detector with the scanning position of the electron beam, and output the image on an output device such as a monitor or printer. In this way, images with good contrast can be outputted quickly and easily.

From another aspect of the present invention, a mass spectrometer includes a wall section constructing a vacuum chamber; an ion generating section disposed within the vacuum chamber for generating ions from a sample; a separating section disposed within the vacuum chamber for separating the generated ions in accordance with their masses; an ion-electron converting section disposed in the vacuum chamber for generating electrons in response to ions separated by the separating section and impinging thereon; and an electron beam detector. The electron beam detector has: a compound semiconductor substrate having an electron beam incident surface and a fluorescence emitting surface, the compound semiconductor substrate converting electrons incident on the electron beam incident surface into fluorescent light to emit the fluorescent light from the fluorescence emitting surface; a photodetector; and connecting means for optically coupling the fluorescence emitting surface of the compound semiconductor substrate with a light incident surface of the photodetector and physically connecting the compound semiconductor substrate with the photodetector, thereby integrating the compound semiconductor substrate and photodetector. The connecting means conducts fluorescent light generated by the compound semiconductor substrate in response to an incident electron beam to the photodetector, and the photodetector detects the fluorescent light. The electron beam detector is mounted on the wall section such that at least the electron beam incident surface of the compound semiconductor substrate is positioned within the vacuum chamber. The ion-electron converting section generates secondary electrons in response to ions impinging on the ion-electron converting section. An application of a predetermined voltage to the compound semiconductor substrate leads the secondary electrons to the electron beam detector, whereby the electron beam detector detects the generated secondary electrons.

In the mass spectrometer of the present invention having this construction, the electron beam detector is, for example, detachably mounted on the wall section of the vacuum chamber, such that at least the electron beam incident surface of the compound semiconductor substrate is positioned within the vacuum chamber. The ion generating section generates ions based on a sample in the vacuum chamber. The separating section separates these ions spatially or temporally in accordance with their masses. The separated ions are irradiated on the ion-electron converting section that includes dynodes. A potential difference relative to the ion-electron converting section is applied to the compound semiconductor substrate in the electron beam detector. Electrons generated by the ion-electron converting section in response to the ions irradiated thereon are guided to and detected by the electron beam detector. Since the electron beam detector in this mass spectrometer has good response, the mass spectrometer can achieve high mass resolution. Here, it is preferable to employ a special or general purpose control device to apply a voltage to the electron beam detector and to perform mass spectrometry of the sample by correlating the separation operation by the separating section to the output of the electron beam detector, thereby outputting the results of this analysis to an output device, such as a monitor or printer. Hence, mass spectrometry results with a high mass resolution can be easily obtained.

From further aspect of the present invention, an ion detector includes an electron beam detector having a compound semiconductor substrate having an electron beam incident surface and a fluorescence emitting surface, the compound semiconductor substrate converting electrons incident on the electron beam incident surface into fluorescent light to emit the fluorescent light from the fluorescence emitting surface; a photodetector; and connecting means for optically coupling the fluorescence emitting surface of the compound semiconductor substrate with a light incident surface of the photodetector and physically connecting the compound semiconductor substrate with the photodetector, thereby integrating the compound semiconductor substrate and photodetector. The connecting means conducts fluorescent light generated by the compound semiconductor substrate in response to an incident electron beam to the photodetector, and the photodetector detects the fluorescent light. The ion detector further includes a microchannel plate disposed in a position opposite the electron beam incident surface of the compound semiconductor substrate in the electron beam detector. The microchannel plate generates secondary electrons in response to incident ions, and the generated secondary electrons are guided to the electron beam incident surface of the electron beam detector.

Hence, the microchannel plate generates secondary electrons in response to incident ions. The electron beam detector detects the secondary electrons. Since the electron beam detector in this ion detector has good response, the ion detector having this construction can perform ion detection with sufficient response characteristics.

From another aspect of the invention, an electron beam detector includes: a compound semiconductor substrate having an electron beam incident surface and a fluorescence emitting surface, the compound semiconductor substrate converting electrons incident on the electron beam incident surface into fluorescent light to emit the fluorescent light from the fluorescence emitting surface; a photodetector; and connecting means for optically coupling the fluorescence emitting surface of the compound semiconductor substrate with a light incident surface of of the photodetector and physically connecting the compound semiconductor substrate with the photodetector, thereby integrating the compound semiconductor substrate and photodetector. The connecting means conducts fluorescent light generated by the compound semiconductor substrate in response to an incident electron beam to the photodetector, and the photodetector detects the fluorescent light. The compound semiconductor substrate includes: a compound semiconductor light emitting layer formed on the surface of the compound semiconductor coating layer through a heterojunction and formed of a compound semiconductor single crystal for converting an incident electron beam into fluorescence.

BEST MODE FOR CARRYING OUT THE INVENTION

Figure 1:
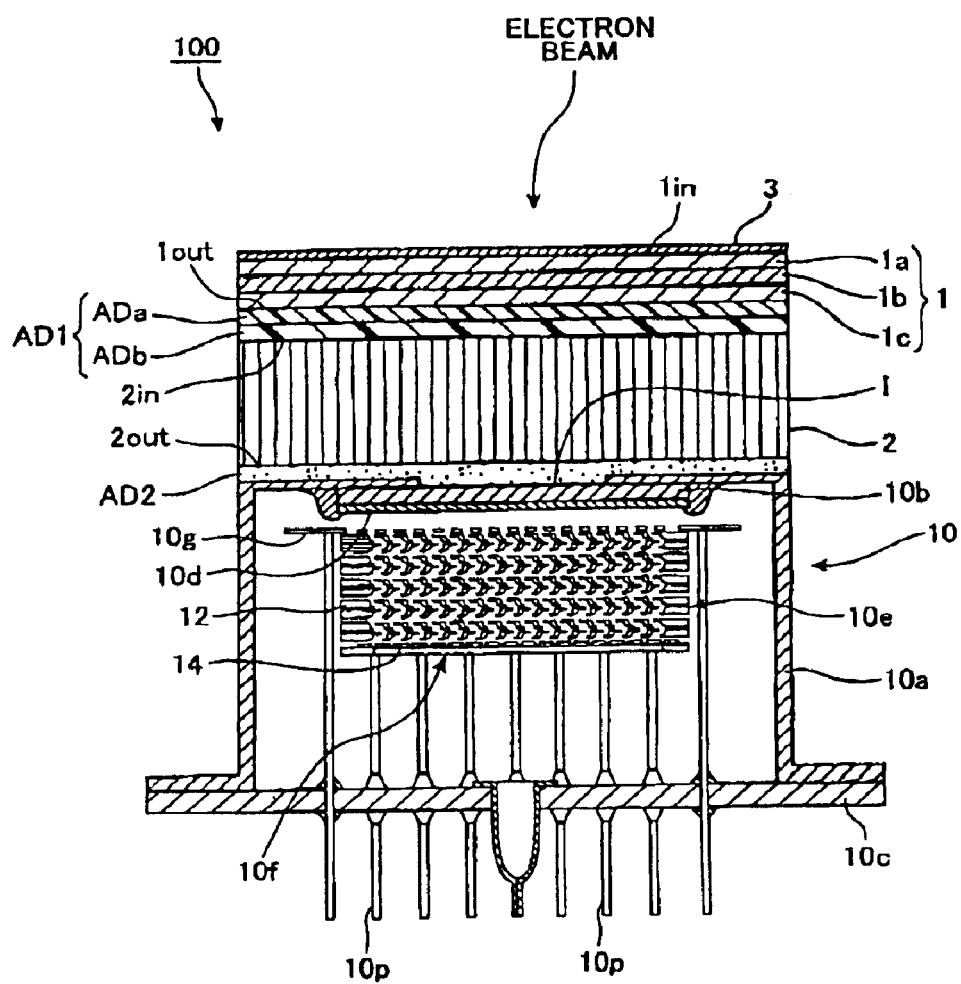
FIG. 1 is a vertical cross-sectional view showing an electron beam detector according to a first embodiment of the present invention.

An electron beam detector according to preferred embodiments of the present invention will be described while referring to the accompanying drawings, wherein like parts and components are designated by the same reference numerals to avoid duplicating description.

First Embodiment

FIG. 1 is a vertical cross-sectional view showing an electron beam detector 100 according to a first embodiment.

The electron beam detector 100 has a substantially cylindrical shape and includes a compound semiconductor substrate 1, a light guide 2, and a photomultiplier tube 10 as the photodetector arranged in the axial direction of the electron beam detector 100, these components being formed integrally. The compound semiconductor substrate 1 functions to convert incident electrons into fluorescent light. The photomultiplier tube 10 has a light incident surface I and functions to detect light incident on the light incident surface I. The light guide 2 is an optical member formed of a fluorescent light transmissive material. The light guide 2 is fixed to the light incident surface I of the photomultiplier tube 10. The compound semiconductor substrate 1 is mounted on the light guide 2. In this way, the compound semiconductor substrate 1 is optically coupled with the light incident surface I of the photomultiplier tube 10 through the light guide 2. In addition, the compound semiconductor substrate 1 and photomultiplier tube 10 are physically connected together. Hence, the electron beam detector 100 is configured such that the compound semiconductor substrate 1 and photomultiplier tube 10 are formed integrally.

The compound semiconductor substrate 1 includes a coating layer 1a, a light-emitting layer 1b, and a substrate layer 1c. The light-emitting layer 1b is interposed between the coating layer 1a and the substrate layer 1c as an intermediate semiconductor layer. In this embodiment, the light-emitting layer 1b is formed of a GaAs compound semiconductor material. GaAs is a single crystal that generates fluorescent light in response to incident electrons. The wavelength of light emitted by GaAs is 870 nm. Both the coating layer 1a and the substrate layer 1c are formed of an AlGaAs compound semiconductor material. With this construction, the compound semiconductor substrate 1 is configured to include GaAs and AlGaAs. Since AlGaAs has a wider energy band-gap than GaAs, and heterojunctions between the coating layer 1a and light-emitting layer 1b and the light-emitting layer 1b and substrate layer 1c are formed, the light emitting efficiency of the compound semiconductor substrate 1 is high. In the present embodiment, a surface of the coating layer 1a (the top surface in FIG. 1, which does not contact the light-emitting layer 1b) provides an electron beam incident surface 1in, while a surface of the substrate layer 1c (the bottom surface in FIG. 1, which is the surface not contacting the light-emitting layer 1b) provides a fluorescence emitting surface 1out.

The compound semiconductor substrate 1 having the construction described above is constructed by forming, in order, the coating layer 1a, the light-emitting layer 1b, and the substrate layer 1c on a substrate not shown in the drawings. The substrate is formed of GaAs. Subsequently, the coating layer 1a is separated from the substrate.

A metal layer 3 is formed on the electron beam incident surface 1in of the compound semiconductor substrate 1 (that is, on the coating layer 1a). For example, the metal layer 3 is formed of aluminum. The metal layer 3 functions as an electrode to which a positive potential is applied in order to accelerate and attract an electron beam. The metal layer 3 is formed thin enough to enable the electron beam to pass therethrough, and more specifically, having a thickness of 30–50 nm. The metal layer 3 can also be formed in a mesh shape in order to improve electron transmittance.

The metal layer 3 functions to suppress electrical charge accumulation (charge-up) within the compound semiconductor substrate 1 due to the charge of the electron beam incident on the compound semiconductor substrate 1. The metal layer 3 functions to reflect fluorescent light generated in the compound semiconductor substrate 1 to the fluorescence emitting surface 1out and emit the fluorescent light from the fluorescence emitting surface 1out to the light incident surface I of the photomultiplier tube 10.

The photomultiplier tube 10 in the present embodiment is a head-on type having a transmissive photocathode. More specifically, the photomultiplier tube 10 has a vacuum vessel that includes a metal side tube 10a, a light incident window (light input faceplate) 10b for blocking an opening at the top of the side tube 10a, and a stem plate 10c for blocking an opening on the bottom of the side tube 10a. The outer surface of the light incident window 10b provides the light incident surface I.

Disposed within the vacuum vessel are a photocathode 10d formed on the inner surface of the light incident window 10b, an electron multiplying section 10e, and an anode section 10f. A converging electrode plate 10g is interposed between the photocathode 10d and the electron multiplying section 10e. A plurality of pins 10p is provided in the stem plate 10c penetrating therethrough.

GaAs is preferably used as the material of the photocathode 10d because the compound semiconductor substrate 1 includes GaAs.

The electron multiplying section 10e is a block shaped stacked-type. The electron multiplying section includes a plurality of stacked stages of dynodes 12.

A plurality of anodes 14 is disposed in the anode section 10f.

The plurality of pins 10p includes a plurality of pins 10p for the electron multiplying section 10e and a plurality of pins for the anode section 10f. Each of the pins 10p for the anodes connects to corresponding anodes 14 through lead wires not shown in the drawings Each of the remaining pins 10p for the electron multiplying section connects to a corresponding stage of the dynodes 12 in the electron multiplying section 10e for applying a predetermined potential to the corresponding stage of the dynodes 12. The electric potential of the side tube 10a is set to 0 volts. The photocathode 10d is electrically connected to the side tube 10a.

The photomultiplier tube 10 having the construction described above has a very quick time response of about 1 ns. As will be described later, the compound semiconductor substrate 1 has a very quick response of about 2 ns. Accordingly, an electron beam detector 100 having very good response can be achieved by assembling the photomultiplier tube 10 with the compound semiconductor substrate 1.

In addition to the multi-anode type photomultiplier tube 10 having a plurality of the anodes 14, as described above, the photomultiplier tube 10 can also be a single-anode type having a single anode. In this case, the single anode 14 is connected to a single anode pin 10p.

Further, the electron multiplying section 10e is not limited to a block-shaped stacked-type electron multiplying section, as described above, but can also be configured of a mesh-type dynode, for example, or of a microchannel plate.

The light guide 2 is formed of a cylindrical or disc-shaped glass plate and includes a light input end face 2in and a light output end face 2out. In the present embodiment, the light input end face 2in and light output end face 2out have substantially the same surface area. An adhesive layer AD1 is interposed between the fluorescence emitting surface 1out of the compound semiconductor substrate 1 (the surface of the substrate layer 1c) and the light input end face 2in of the light guide 2 for fixing the relative positions of the light guide 2 and the compound semiconductor substrate 1. The compound semiconductor substrate 1 in the present embodiment is formed of a fluorescent light transmissive material. In the present embodiment, the adhesive layer AD1 includes a SiN layer ADa and a $SiO_2$ layer ADb. More specifically, the SiN layer ADa is formed on the fluorescence emitting surface 1out of the substrate layer 1c, and the $SiO_2$ layer ADb is further formed on the SiN layer ADa. The refractive index over the entire adhesive layer AD1 is 1.5. The SiN layer ADa functions as a reflection preventing coating. Therefore, when fluorescent light generated in the compound semiconductor substrate 1 passes through the adhesive layer AD1, the SiN layer ADa restrains the light from reflecting back toward the compound semiconductor substrate 1.

Here, the SiN layer ADa is formed on the substrate layer 1c by sputtering. Hence, the SiN layer ADa is coupled to the compound semiconductor substrate 1 with a strong bond. The $SiO_2$ layer ADb is also formed on the SiN layer ADa by sputtering, enabling the $SiO_2$ layer ADb to achieve a strong bond with the SiN layer ADa. The $SiO_2$ layer ADb is fused to the light input end face 2in of the light guide 2. Both the $SiO_2$ layer ADb and the light glass 2 (glass) are fused by heat, since they are both silicon oxide In this way, the adhesive layer AD1 reliably fixes to the compound semiconductor substrate 1 as a whole to the light guide 2.

An adhesive layer AD2 formed of a fluorescent light transmissive adhesive is interposed between the light output end face 2out of the light guide 2 and the light incident surface I of the photomultiplier tube 10 (the outer surface of the light incident window 10b). The adhesive layer AD2 fixes the relative positions of the light guide 2 and the photomultiplier tube 10. The adhesive is formed of, for example, a fluorescent light transmissive synthetic resin. For example, the index of refraction of the adhesive layer AD2 is 1.5.

The electron beam detector 100 of the present embodiment having the construction described above has the following operations.

When attempting to detect an electron beam, a described positive potential is applied to the metal layer 3, causing the electron beam that is the object of detection to be attracted to the metal layer 3. The electron beam passes through the metal layer 3 and impinges on the electron beam incident surface 1in of the compound semiconductor substrate 1. The compound semiconductor substrate 1 generates fluorescent light in response to the incident electron beam. The fluorescent light is emitted from the fluorescence emitting surface 1out, either directly or through reflection by the metal layer 3, to impinge on the light input end face 2in via the adhesive layer AD1. The fluorescent light passes through the light guide 2, exits from the light output end face 2out, passes through the adhesive layer AD2, and arrives at the light incident surface I of the photomultiplier tube 10.

The fluorescent light impinged on the light incident surface I passes through the light incident window 10b to impinge on the photocathode 10d. The photocathode 10d photoelectrically convert the fluorescent light into photoelectrons in response to the incident fluorescence and emits the photoelectrons into the vacuum vessel of the photomultiplier tube 10. These photoelectrons are multiplied through multiple stages of the electron multiplying section 10e and collected by the anode section 10f. After being collected by the anode section 10f, the electrons are extracted from the photomultiplier tube 10 via the anode pins 10p as electric signals indicating the magnitude of the electron beam incident on the electron beam detector 100.

In the electron beam detector 100 of the present embodiment described above, the light guide 2 optically couples the fluorescence emitting surface 1out (surface of the substrate layer 1c) opposite to the electron beam incident surface 1in (surface of the coating layer 1a) of the compound semiconductor substrate 1 to the light incident surface I of the photomultiplier tube 10, and physically connects the compound semiconductor substrate 1 to the photomultiplier tube 10, thereby integrating the compound semiconductor substrate 1 and the photomultiplier tube 10. After the compound semiconductor substrate 1 converts electrons traveling through the metal layer 3 into fluorescent light, the light guide 2 leads the fluorescent light to the photomultiplier tube 10, which detects the fluorescent light to detect the incident electron beam Since both the compound semiconductor substrate 1 and the photomultiplier tube 10 have very good response, the electron beam can be detected with high response.

Figure 2:
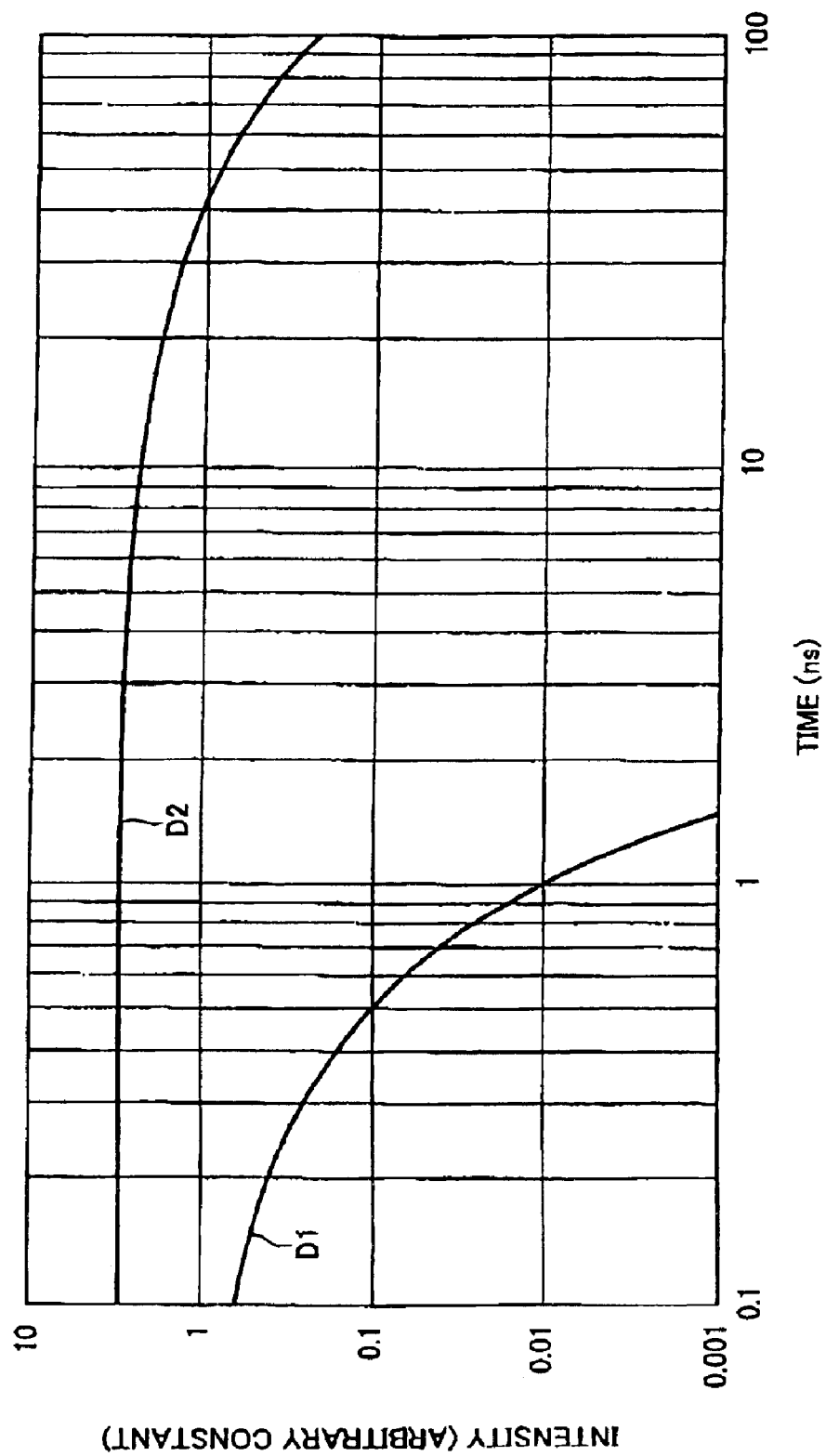
FIG. 2 is a graph showing the dependence of current signal intensity (arbitrary constant) on elapsed time (nm)

FIG. 2 is a graph showing the dependence of the current signal intensity (arbitrary constant) outputted from the electron beam detector 100 on elapsed time (ns) when electrons are impinged in pulses on the compound semiconductor substrate 1 described above (D1: embodiment). In the present embodiment, the thicknesses of the layers 1a, 1b, and 1c are 100 nm, 5,000 nm, and 100 nm, respectively. FIG. 2 also shows a dependence of a current signal intensity (arbitrary constant) emitted from the electron beam detector 100 on elapsed time (ns) when a fluorescent material (P47) is provided in place of the compound semiconductor substrate 1 in the electron beam detector 100 and electrons are impinged in pulses on the fluorescent material (D2: comparison).

As shown in FIG. 2, the time required for the intensities of the preferred embodiment and the comparison to drop to 10% of the intensity at the time of impingement is 0.6 ns and 90 ns, respectively, illustrating that the electron beam detector 100 of the present embodiment has a quicker response. More particularly, the absolute response rate in the present embodiment is very high, since the above decay time is equal to or less than 2 ns.

The electron beam detector 100 of the present embodiment can be used, for example, in a scanning type electron microscope (SEM) and a mass spectrometer.

Figure 3:
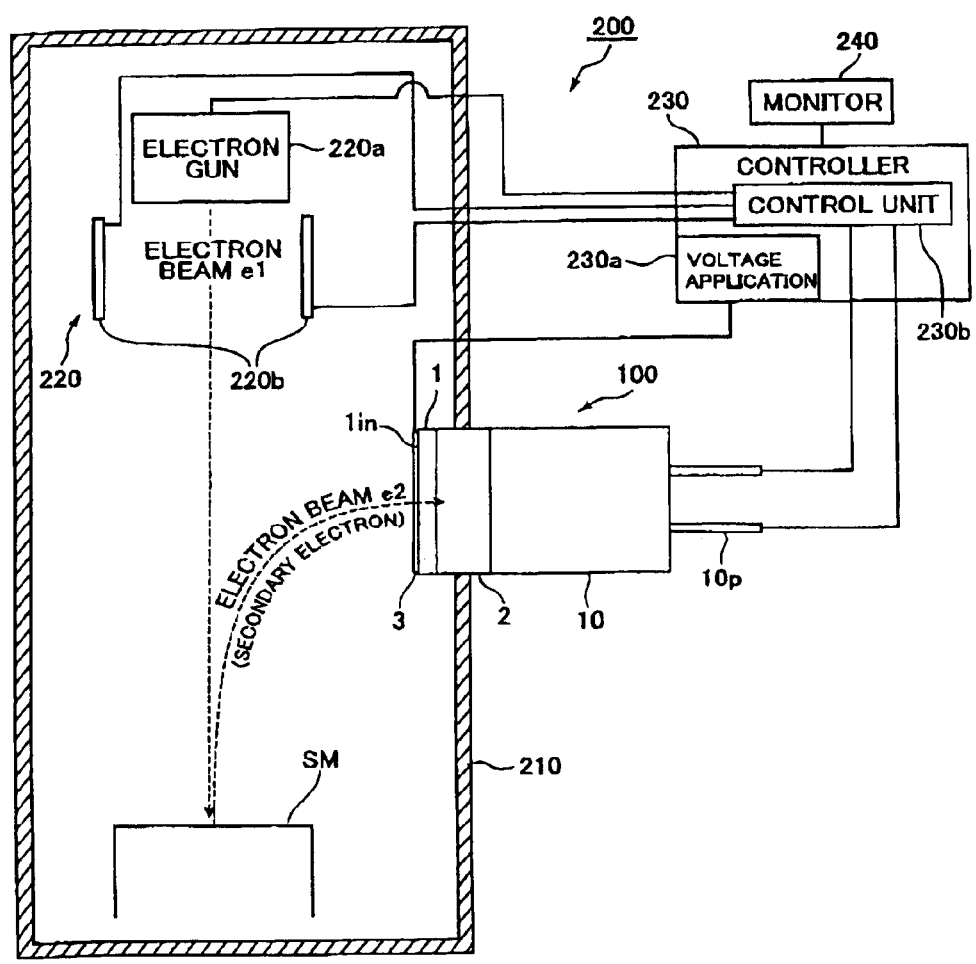
FIG. 3 is an explanatory diagram showing the major parts of a scanning type electron microscope employing the electron beam detector of FIG. 1.

FIG. 3 is an explanatory diagram showing the major portions of a scanning type electron microscope 200 that employs the electron beam detector 100 of the present embodiment. The scanning type electron microscope 200 includes a wall section 210 that constructs a vacuum chamber. An electron beam scanning section 220 and a sample SM are disposed within the vacuum chamber, confronting each other. The electron beam scanning section 220 includes an electron gun 220a and a pair of deflection electrodes (deflection plates) 220b. The electron beam scanning section 220 generates and scans a surface of the sample SM with an electron beam e1 to induce secondary electrons e2 from the sample SM.

The electron beam detector 100 of the present embodiment is detachably mounted on the wall section 200, such that at least the metal layer 3 and the electron beam incident surface 1in of the compound semiconductor substrate 1 are positioned within the vacuum chamber. The electron beam detector 100 thus detects the secondary electrons e2.

Both the electron beam detector 100 and the electron beam scanning section 220 are connected to a control device 230 including a computer The control device 230 includes a voltage applying section 230a electrically connected to the metal layer 3 of the electron beam detector 100. The voltage applying section 230a applies a predetermined positive voltage to the metal layer 3 to raise the potential of the metal layer 3 to a predetermined potential relative to that of the sample SM, thereby leading secondary electrons e2 generated from the sample SM to the electron beam detector 100. The control device 230 also includes a control unit 230b. The control unit 230b is connected to the electron gun 220a, the pair of deflection electrodes 220b, the plurality of pins 10p in the photomultiplier tube 10, and a monitor 240. The control unit 230b controls each component in the scanning type electron microscope 200. By correlating the scanning position of the electron beam e1 defined by a voltage applied to the deflection electrodes 220b, with the output from the electron beam detector 100, the control unit 230b controls the monitor 240 to display an image of the sample SM thereon.

The scanning type electron microscope 200 having the construction described above operates in the following way under control by the control device 230.

When the electron gun 220a irradiates the electron beam e1 on the sample SM, the deflection electrodes 220b deflect the electron beam e1 to scan the surface of the sample SM. As a result, secondary electrons are emitted from the surface of the sample SM. These secondary electrons are led to the electron beam detector 100 as the electron beam e2. Electric signals are outputted via the anode pins 10p in response to the incident electron beam e2. Here, the sum of the outputs from anode pins 10p indicates the sum of the magnitude of the electron beam e2 incident on the electron beam detector 100. Therefore, the control unit 230b synchronizes and correlates the sweeping voltage value of the deflection electrodes 220b (scanning position of the electron beam e1) with the total sum of outputs from the anode pins 10p serving as the output result from the electron beam detector 100 to display an image of the sample SM.

As described above, in the scanning type electron microscope 200, at least the metal layer 3 of the electron beam detector 100 and the electron beam incident surface 1in of the compound semiconductor substrate 1 are disposed within the vacuum chamber. Accordingly, by scanning the surface of the sample SM disposed in the vacuum chamber with the electron beam e1, the secondary electrons generated from the sample SM can be guided to the electron beam detector 100 to produce an image of the sample SM.

Figure 4:
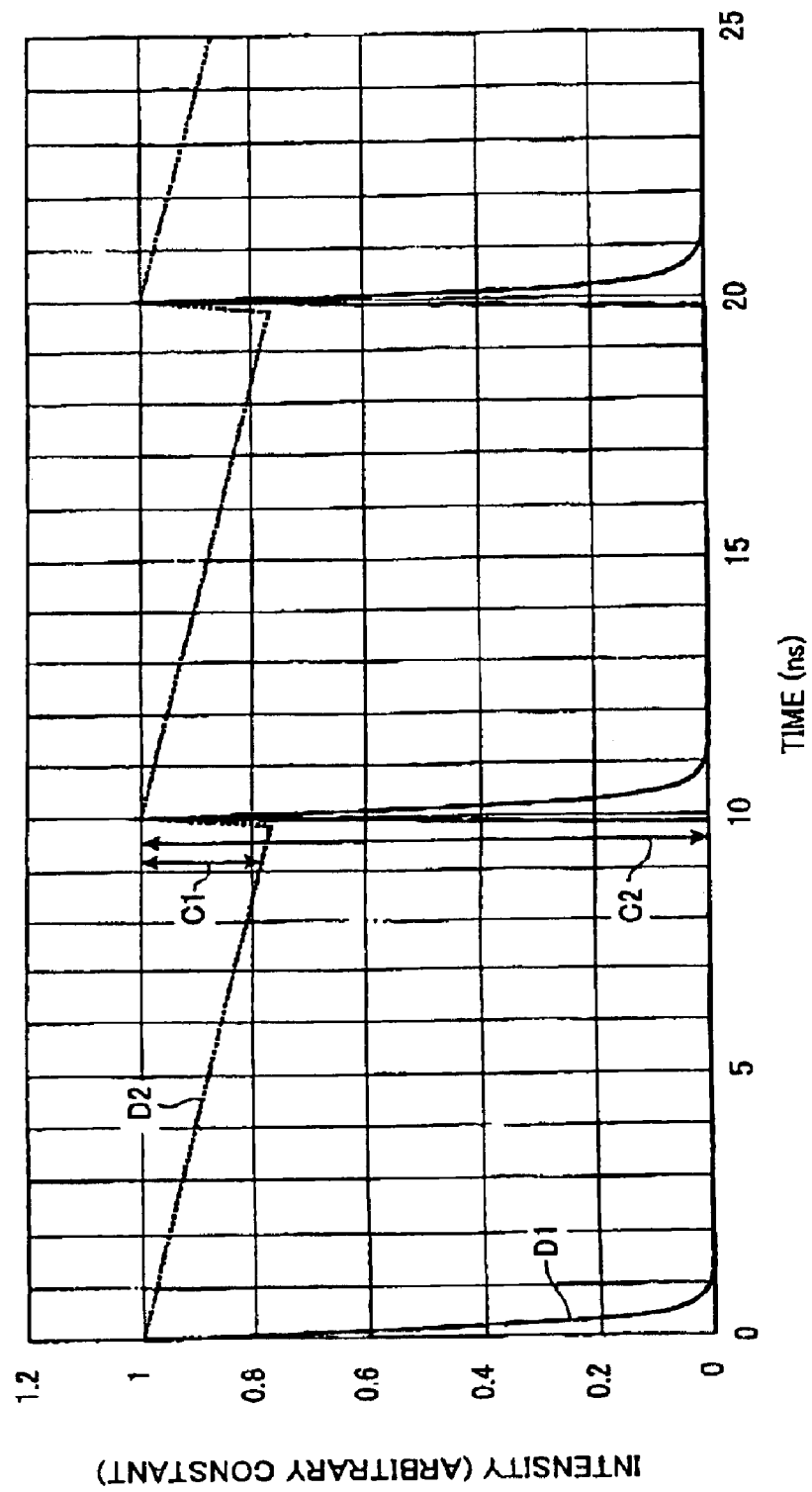
FIG. 4 is a graph showing the dependence of intensity (arbitrary constant) of a current signal outputted from the electron beam detector employed in the scanning type electron microscope of FIG. 3 on elapsed time (nm)

FIG. 4 is a graph showing the dependence of intensity (arbitrary constant) of the current signal outputted from the electron beam detector 100 in the scanning type electron microscope 200 described above to elapsed time (ns) D1 indicates data for the electron beam detector 100 of the present embodiment, while D2 indicates data for the above-described comparison using a fluorescent material (P47) in place of the compound semiconductor substrate 1. The surface area of the sample SM is defined by an aggregate of microregions arranged as a matrix, with each microregion denoting a pixel. When the electron beam e1 is irradiated in pulses on each pixel, the time interval required to scan a pixel is 10 ns.

The comparative example requires 90 ns for the current signal intensity to decay. Accordingly, afterglow is generated in the comparative example when scanning at time intervals of 10 ns. However, with the present embodiment, the intensity is decayed within the time period less than 2 ns. Therefore, no afterglow occurs in the present embodiment. Contrast in the present embodiment is indicated by a symbol C2. The contrast in the comparative example is indicated by a symbol C1. As can be seen from FIG. 4, by using the electron beam detector 100 of the present embodiment, it is possible to achieve an image having much better contrast than that in the comparative example. Further, scanning speed can be improved in the present embodiment since the decay time is short. That is, it is possible to shorten the scanning interval to less than 10 ns.

Figure 5:
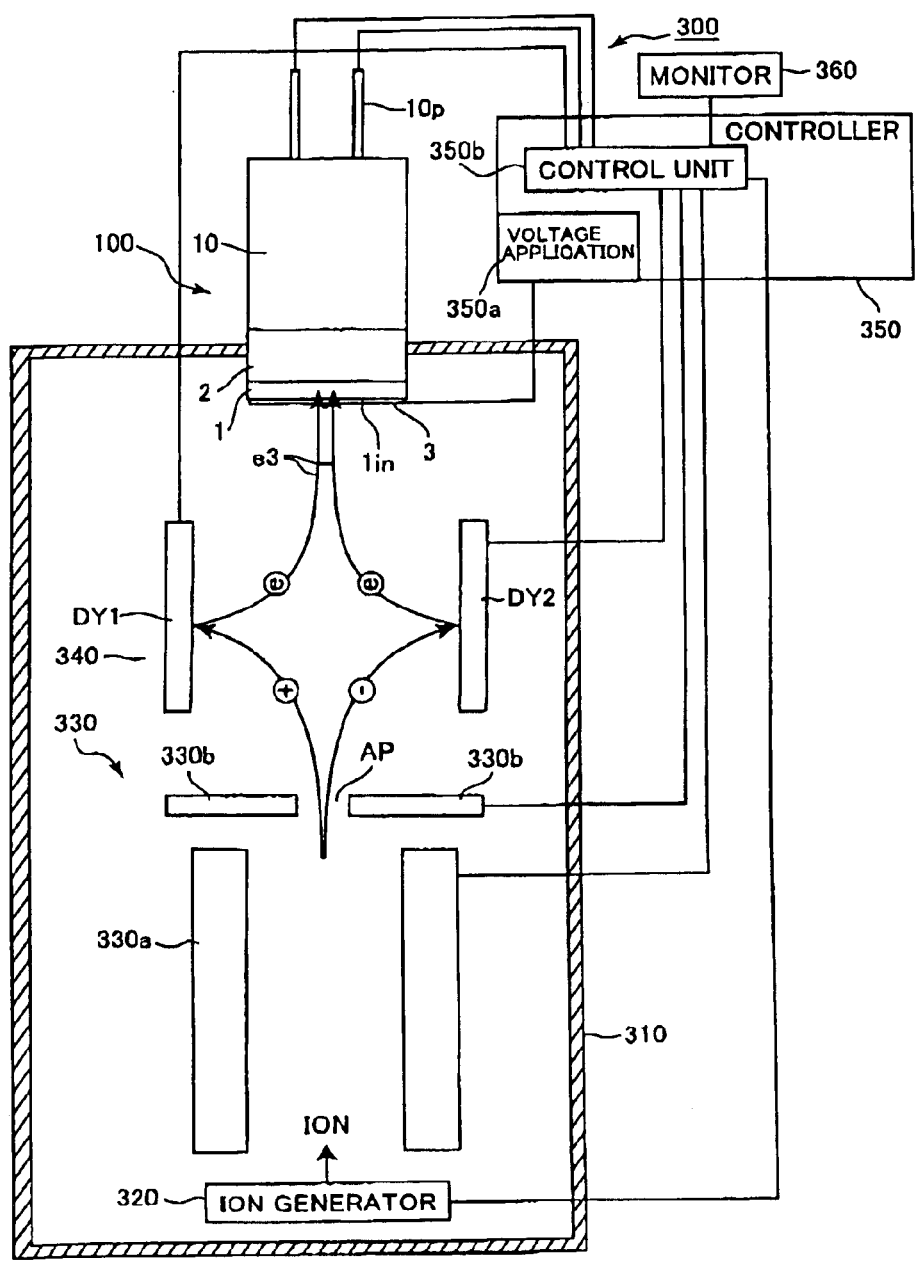
FIG. 5 is an explanatory diagram showing the major parts of a mass spectrometer employing the electron beam detector of FIG. 1.

FIG. 5 is an explanatory diagram showing the major parts of a mass spectrometer 300 employing the electron beam detector 100 of the present embodiment.

The mass spectrometer 300 includes a wall section 310 constructing a vacuum chamber. Within the vacuum chamber are provided an ion generating section 320, a separating section 330, and a dynode section (ion-electron converting section) 340.

The ion generating section 320 functions to generate ions from a sample. A gaseous sample or heated and/or vaporized sample that are the object of mass spectrometry are introduced into the ion generating section 320. The ion generating section 320 includes, for example, a filament not shown in the drawings. By bombarding the sample with thermoelectrons generated by the filament, the sample is ionized, the ions generated from the sample are guided to the separating section 330.

The separating section 330 functions to separate, either spatially or temporally, ions generated in the ion generating section 320 according to their mass. In the present embodiment, the separating section 330 includes a quadrupole electrode 330a formed of four cylindrical electrodes and an aperture wall section 330b, thereby spatially separating ions according to their mass.

The aperture wall section 330b is disposed at a predetermined position between the quadrupole electrode 330a and the dynode section 340 and is formed with an aperture AP for allowing ions to pass therethrough. By applying a voltage superimposing a constant voltage with an AC voltage of a predetermined frequency to the quadrupole electrode 330a, ions having a mass corresponding to the predetermined frequency among ions guided from the ion generating section 320 can be spatially separated from ions having other masses, passed through the aperture AP, and impinged on the dynode section 340.

The dynode section 340 is positioned on the opposite side of the separating section 330 with respect to the aperture wall section 330b. The dynode section 340 functions to emit secondary electrons e3 in response to incident ions. In the present embodiment, the dynode section 340 includes a first dynode DY1 for receiving positive ions and a second dynode DY2 for receiving negative ions.

The electron beam detector 100 of the present embodiment is detachably mounted on the wall section 310, such that at least the metal layer 3 and the electron beam incident surface 1in of the compound semiconductor substrate 1 are positioned within the vacuum chamber, for detecting the secondary electrons e3.

When it is desirable to attract positive ions for analysis from among the ions generated by the ion generating section 320, a negative voltage is applied to the first dynode DY1. Positive ions in the separating section 330 having a mass corresponding to the frequency of the AC voltage applied to the quadrupole electrode 330a pass through the aperture AP and collide with the first dynode DY1. As the ions collide with the first dynode DY1, secondary electrons are emitted from the surface of the first dynode DY1 and are guided to the electron beam detector 100 as the electron beam e3. Electric signals are outputted from the anode pins 10p in response to the incident electron beam e3.

When analyzing negative ions, on the other hand, a positive voltage is applied to the second dynode DY2. Negative ions in the separating section 330 having a mass corresponding to the frequency of the AC voltage applied to the quadrupole electrode 330a pass through the aperture AP and collide with the second dynode DY2. As the ions collide with the second dynode DY2, secondary electrons are emitted from the surface of the second dynode DY2 and are guided to the electron beam detector 100 as the electron beam e3. Electric signals are outputted from the anode pins 10p in response to the incident electron beam e3.

The electron beam detector 100, the ion generating section 320, the separating section 330, and the dynode section 340 are connected to a control device 350 including a computer. The control device 350 includes a voltage applying unit 350a. The voltage applying unit 350a is connected to the metal layer 3 of the electron beam detector 100. By applying a predetermined positive voltage to the metal layer 3, a predetermined potential relative to the dynode section 340 is applied to the metal layer 3, and the secondary electrons e3 generated by the dynode section 340 are guided to the electron beam detector 100.

The control device 350 further includes a control unit 350b. The control unit 350b is connected to a filament not shown in the drawing disposed in the ion generating section 320, the quadrupole electrode 330a and the aperture wall section 330b of the separating section 330, the first and second dynodes DY1 and DY2 of the dynode section 340, the pins 10p of the photomultiplier tube 10, and a monitor 360. The control unit 350b controls each component in the mass spectrometer 300. The control unit 350b correlates the output from the electron beam detector 100 with the masses of the separated ions corresponding to the frequency of the AC voltage applied to the quadrupole electrode 330a and controls the monitor 360 to display the spectrometry results of the sample.

The mass spectrometer 300 having the construction described above operates as follows.

The control unit 350b sweeps frequencies of the AC voltage applied to the quadrupole electrode 330a of the separating section 330, causing ions of a corresponding mass to irradiate sequentially on a corresponding dynode (the first dynode DY1 or the second dynode DY2). When ions are irradiated on the dynode, secondary electrons are emitted from the surface of the dynode and are guided to the electron beam detector 100 as the electron beam e3. Electric signals are outputted from the anode pins 10p in response to the incident electron beam e3. Here, the sum of output from all the anode pins 10p denotes the sum of the magnitude of the electron beam e3 incident on the electron beam detector 100. Accordingly, the control unit 350b synchronizes and correlates the sweeping value of the AC voltage frequency (mass of separated ions) with the total sum of values outputted from all anode pins 10p as the output result of the electron beam detector 100 to display the spectrometry results of the sample on the monitor 360.

Various types of the separating section 330 can be employed in place of the quadrupole electrode type described above, provided that the separating section 330 separates ions spatially or temporally according to mass.

If the separating section 330 is a flight tube, for example, the time required for ions to pass through the flight tube differs according to their mass. Accordingly, the time required for the ions to reach the first dynode DY1 or second dynode DY2 differs according to mass. In this way, the flight tube temporally separates the ions according to mass. Since the sum of current values outputted from all anode pins 1op at a certain time indicates the amount of a certain ions detected at that time among all ions having different masses, the amount of ions of each mass is determined by monitoring variations in the detected current.

When the separating section 330 is a magnetic field distribution type device for generating a magnetic field, the flight trajectory of the ions differs according to mass. Hence, ions can be separated spatially according to mass. By varying the magnetic flux density of the separating section 330, it is possible to change the mass at which ions are allowed to pass through the aperture AP. Therefore, by monitoring change in the sum of current values outputted from the anode pins 1op over changes in time while sweeping the magnetic flux density or scanning the position of the aperture AP, the sum of these current values indicates the amount of ions at masses corresponding to elapsed times. Hence, the mass of the ions can be determined.

In the mass spectrometer 300 described above, at least the metal layer 3 of the photomultiplier tube 10 and the electron beam incident surface 1in of the compound semiconductor substrate 1 are disposed within the vacuum chamber. In the vacuum chamber, the separating section 330 spatially or temporally separates ions generated from a sample not shown in the drawing according to the masses of the ions. When ions separated by the separating section 330 are irradiated on the first dynode DY1 or the second dynode DY2, the secondary electrons e3 is generated from the dynode. The secondary electrons e3 are guided to the electron beam detector 100. Mass spectrometry of the sample is performed based on output from the electron beam detector 100. Since the electron beam detector 100 has a fast response rate, as described above, mass resolution can be greatly improved.

First Variation

In the above description, while the compound semiconductor substrate 1 of the electron beam detector 100 has the coating layer 1a, the coating layer 1a may not be necessary. Hence, the compound semiconductor substrate 1 can be configured of only the light-emitting layer 1b and the substrate layer 1c. In this case, the light-emitting layer 1b and substrate layer 1c are formed in this order on the substrate not shown in the drawings. Subsequently, the light-emitting layer 1b is separated from the substrate. In the present variation, however, it is preferable to bond the compound semiconductor substrate 1 to the light guide 2 through the substrate layer 1c. This is because the light guide 2 may contaminate the light-emitting layer 1b when the light-emitting layer 1b is affixed directly to the light guide 2. Specifically, alkali metal within the light guide 2 immigrates into the light-emitting layer 1b to contaminate the light-emitting layer 1b, which is undesirable. In the present variation, the surface of the light-emitting layer 1b (the surface not in contact with the substrate layer 1c) provides the electron beam incident surface 1in, while the surface of the substrate layer 1c (the surface not contacting the light-emitting layer 1b) provides the fluorescence emitting surface 1out. The metal layer 3 is formed on the electron beam incident surface 1in of the light-emitting layer 1b. The fluorescence emitting surface 1out is connected to the light guide 2 through the adhesive layer AD1.

Second Variation

Further, when the compound semiconductor substrate 1 does not have the coating layer 1a, as described in the variation above, it is possible to form or not form the metal layer 3 on the light-emitting layer 1b.

When the metal layer 3 is not formed on the light-emitting layer 1b, the electron beam incident surface 1in on the light-emitting layer 1b is exposed, enabling the electron beam to directly impinge on the light-emitting layer 1b. Further, by increasing the carrier concentration in the outer surface of the compound semiconductor substrate 1 (that is, the surface including the electron beam incident surface 1in of the light-emitting layer 1b or the entire light-emitting layer 1b) in this case, charge storage can be suppressed in the compound semiconductor substrate 1.

Figure 6:
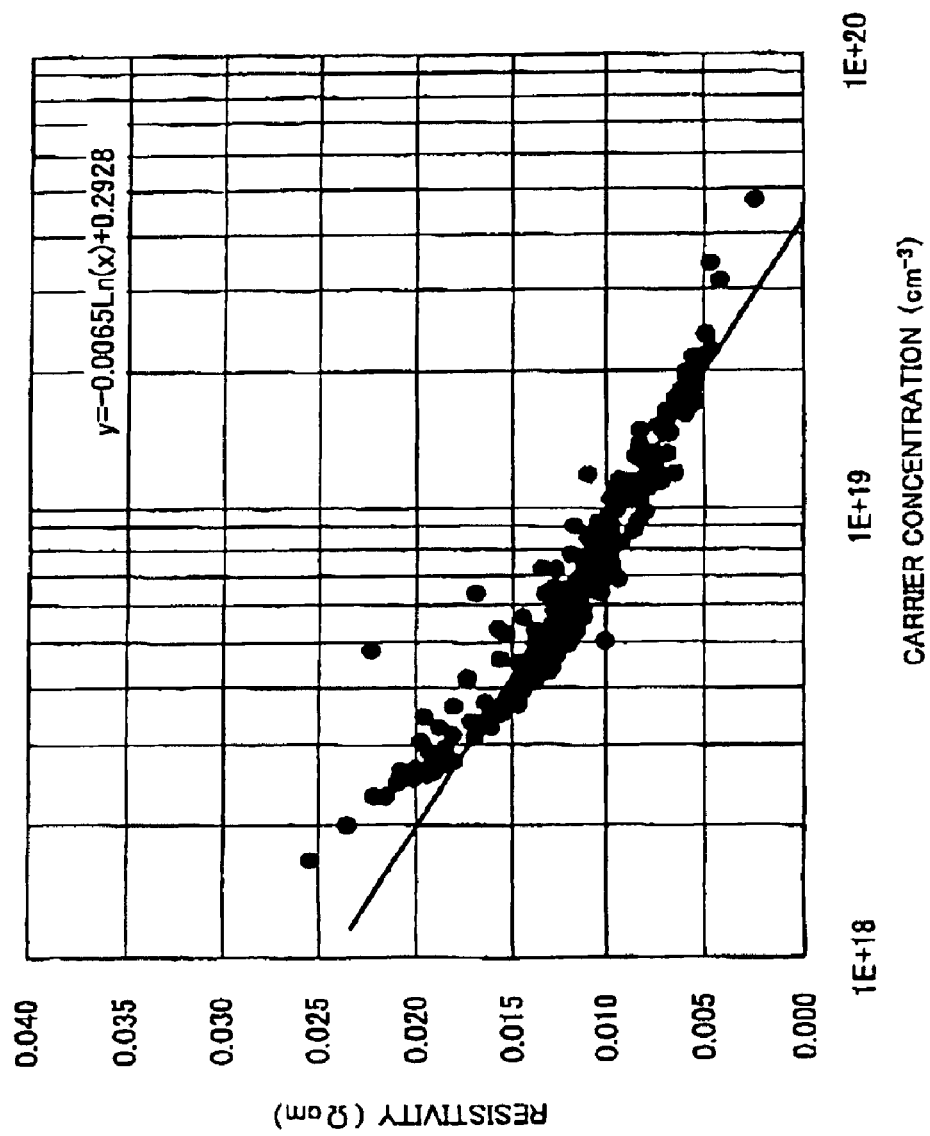
FIG. 6 is a graph showing the relationship between the carrier concentration ($cm^{-3}$) of GaAs and resistivity ($\Omega cm$)

FIG. 6 shows the relationship between the carrier concentration ($cm^{-3}$) and the resistivity ($\Omega cm$) of GaAs. FIG. 6 also shows an equation between the resistivity y and the carrier concentration x. Here, when the activation rate is about 1 for example, that is, when about 100% of the sample is ionized, the carrier concentration equals the concentration of impurities. As can be seen from FIG. 6, the resistivity drops about to a point at which a desirable conductive state is achieved at a carrier concentration (impurity concentration) greater than or equal to $1 \times 10^{19}$ $cm^{-3}$ when the activation rate is about 1. Accordingly, it is preferable to set the carrier concentration greater than or equal to $1 \times 10^{19}$ $cm^{-3}$ in order to suppress charge-up.

When the metal layer 3 is not provided on the light-emitting layer 1b, as described above, the compound semiconductor substrate 1 can be set to a positive potential by applying a desired positive voltage to the conductive portion of the compound semiconductor substrate 1 (specifically, the surface including the electron beam incident surface 1in of the light-emitting layer 1b or the entire light-emitting layer 1b), thereby attracting the electron beam.

When the electron beam detector 100 is not provided with the coating layer 1a or is not provided with the metal layer 3, as described above, the electron beam detector 100 can still be applied to the scanning type electron microscope 200 and mass spectrometer 300 described above. However, since the metal layer 3 is not provided in the present variation, the electron beam detector 100 is mounted on the wall section 210 or the wall section 310, such that at least the electron beam incident surface 1in of the compound semiconductor substrate 1 is positioned within the vacuum chamber. Further, the conductive portion of the compound semiconductor substrate 1 (the electron beam incident surface 1in, for example) is connected to the voltage applying section 230a or voltage applying unit 350a.

Further, the electron beam detector 100 in the embodiments described below can be applied to the scanning type electron microscope 200 and mass spectrometer 300 described above.

Second Embodiment

Figure 7:
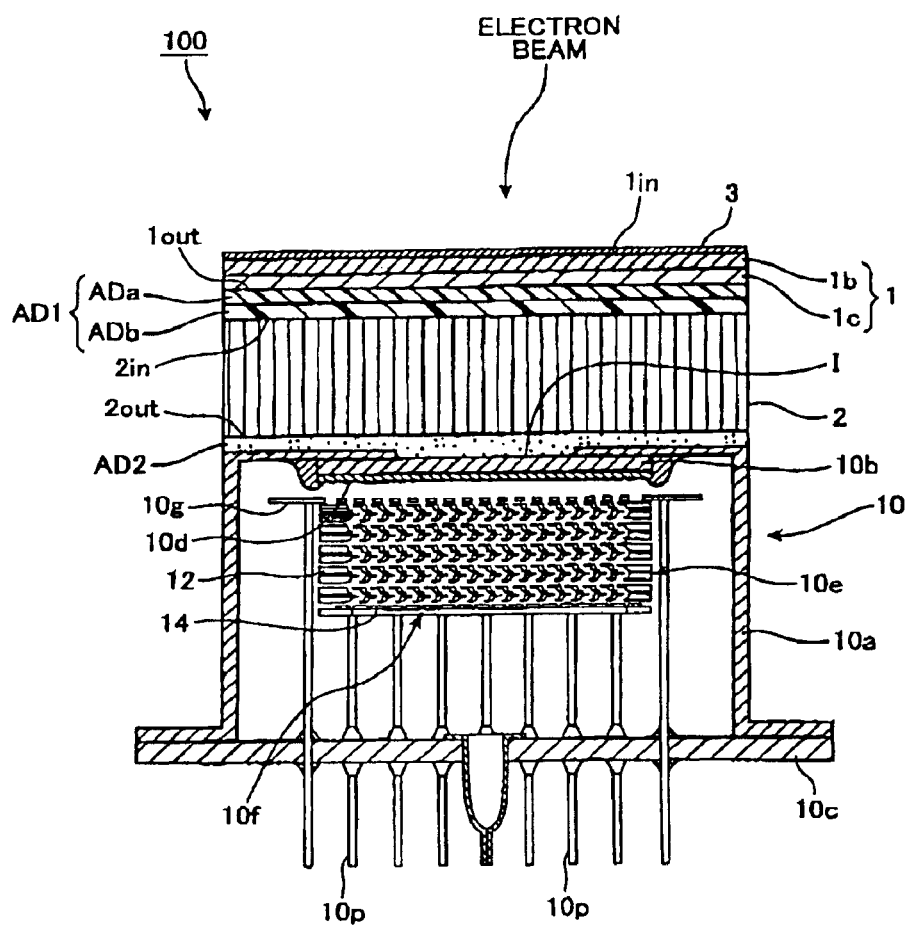
FIG. 7 is a vertical cross-sectional view showing an electron beam detector according to a second embodiment.

FIG. 7 is a vertical cross-sectional view showing the electron beam detector 100 according to a second embodiment. The electron beam detector 100 of the present embodiment differs from that of the first embodiment only in that the compound semiconductor substrate 1 of the present embodiment includes only the substrate layer 1c formed of an AlGaAsP compound semiconductor material and the light-emitting layer 1b formed of a GaAsP compound semiconductor material that is formed on the substrate layer 1c.

The GaAsP compound semiconductor material is a single crystal that generates fluorescent light in response to incident electron beams. The wavelength of light emitted from the GaAsP is 720 nm. As in the first variation of the first embodiment, the compound semiconductor substrate 1 of the present embodiment does not include the coating layer 1a, and the metal layer 3 is provided directly on the light-emitting layer 1b. Therefore, the surface of the light-emitting layer 1b (the top surface in FIG. 7 that does not contact the substrate layer 1c) provides the electron beam incident surface 1in, while the surface of the substrate layer 1c (the bottom surface in FIG. 7 that does not contact the light-emitting layer 1b) provides the fluorescence emitting surface 1out. The metal layer 3 is formed on the electron beam incident surface 1in of the light-emitting layer 1b. The fluorescence emitting surface 1out is directly connected to the light guide 2 through the adhesive layer AD1.

When the compound semiconductor substrate 1 is formed of GaAsP, as described above, the material forming the photocathode 10d of the photomultiplier tube 10 is preferably a multialkali.

The electron beam detector 100 having the construction of the present embodiment can achieve sufficient good response characteristics.

First Variation

Figure 8:
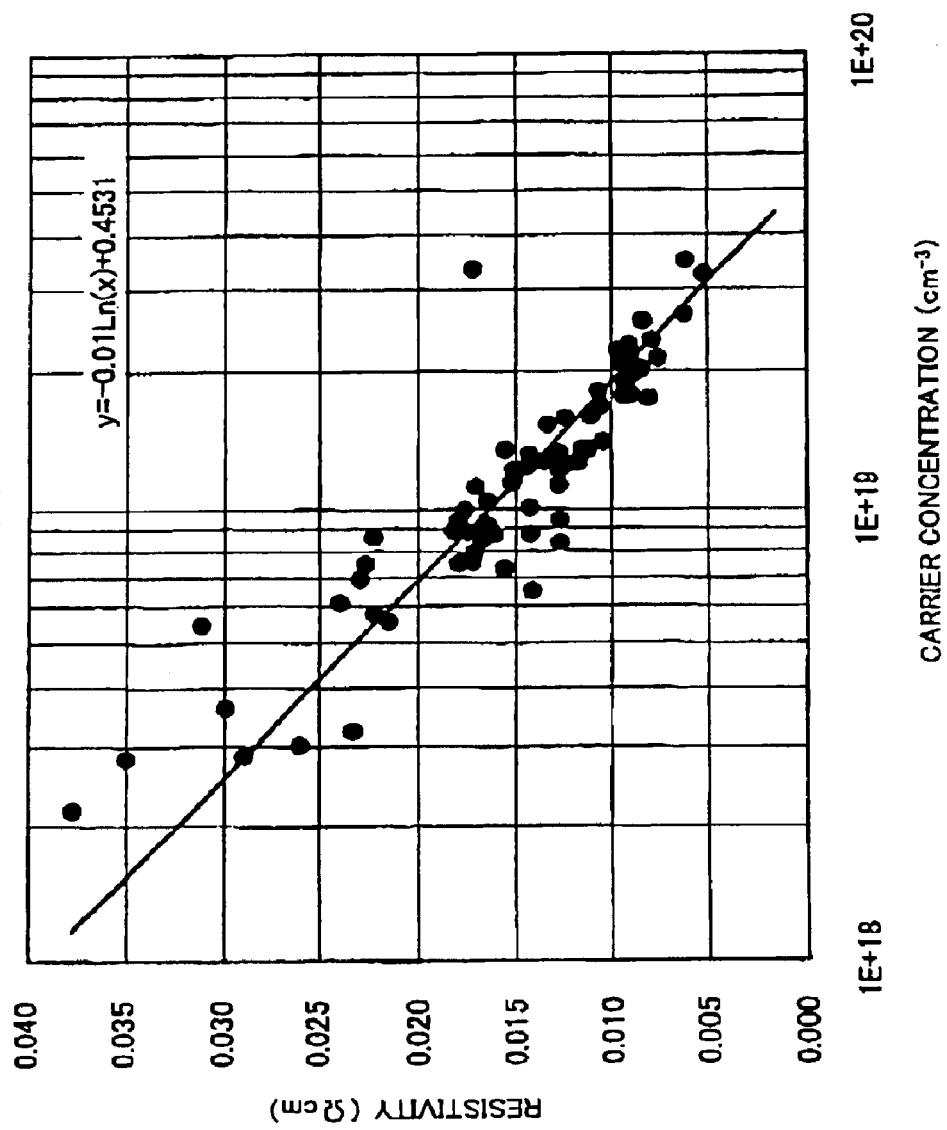
FIG. 8 is a graph showing the relationship between the carrier concentration ($cm^{-3}$) of GaAsP and resistivity ($\Omega cm$)

As in the second variation of the first embodiment, the metal layer 3 need not be formed on the compound semiconductor substrate 1 in the present variation. In this case, the electron beam incident surface 1in of the light-emitting layer 1b is exposed. When the metal layer 3 is not formed, as described above, charge storage can be suppressed in the compound semiconductor substrate 1 by increasing the carrier concentration in the surface of the compound semiconductor substrate 1 (the surface including the electron beam incident surface 1in of the light-emitting layer 1b or the entire light-emitting layer 1b). FIG. 8 shows the relationship between the carrier concentration of GaAsP ($cm^{-3}$) and the resistivity ($\Omega cm$). As can be seen from FIG. 8, the resistivity in GaAsP also drops about to a point at which a desirable conductive state is achieved at a carrier concentration greater than or equal to $1 \times 10^{19}$ $cm^{-3}$. Accordingly, it is preferable to set the carrier concentration greater than or equal to $1 \times 10^{19}$ $cm^{-3}$.

Second Variation

In the above description, the coating layer 1a is not provided on the light-emitting layer 1b. However, as in the first embodiment, the coating layer 1a formed of an AlGaAsP compound semiconductor material, which is the same material as the substrate layer 1c, can be provided on the GaAsP light-emitting layer 1b.

Third Variation

The light-emitting layer 1b of the compound semiconductor substrate 1 can be formed of different compound semiconductor materials other than the (1) GaAs and (2) GaAsP described above. Here, the light-emitting layer 1b is preferably formed of a Group III-V compound semiconductor material, such as (1) GaAs, (2) GaAsP, (3) GaN, (4) GaAlN, or (5) GaInN, or a Group II-VI compound semiconductor material, such as (6) ZnS or (7) ZnSe. All of these compound semiconductors are single crystals generating fluorescent light in response to an incident electron beam. The wavelengths of the light emitted from these compound semiconductor materials other than (1) and (2) are (3) 360 nm, (4) 360 nm or less, (5) 360–620 nm, (6) 350 nm, and (7) 480 nm.

Accordingly, the light-emitting layer 1b is preferably formed from at least one material of a group including (1) GaAs, (2) GaAsP, (3) GaN, (4) GaAlN, (5) GaInN, (6) ZnS, and (7) ZnSe.

Even if the light-emitting layer 1b is formed of any one of the above materials, it is preferable that the compound semiconductor substrate 1 includes at least the light-emitting layer 1b and the substrate layer 1c, and the substrate layer 1c is connected to the light guide 2 The coating layer 1a and metal layer 3 can be provided or not provided on the light-emitting layer 1b. Further, the metal layer 3 can be directly formed on the light-emitting layer 1b. However, when the coating layer 1a or metal layer 3 is not provided on the light-emitting layer 1b, it is preferable to adjust the carrier concentration at least in the surface including the electron beam incident surface 1in of the light-emitting layer 1b or the entire light-emitting layer 1b to a carrier concentration more than or equal to a predetermined carrier concentration ($1 \times 10^{19}$ $cm^{-3}$, for example), and reduce the resistivity in the material until a predetermined conductive state is achieved, thereby suppressing charge-up in the compound semiconductor substrate 1.

If the light-emitting layer 1b of the compound semiconductor substrate 1 is formed of any one of the above-described materials (1)–(7), the material of the photocathode 10d is preferably a bialkali.

Third Embodiment

Figure 9:
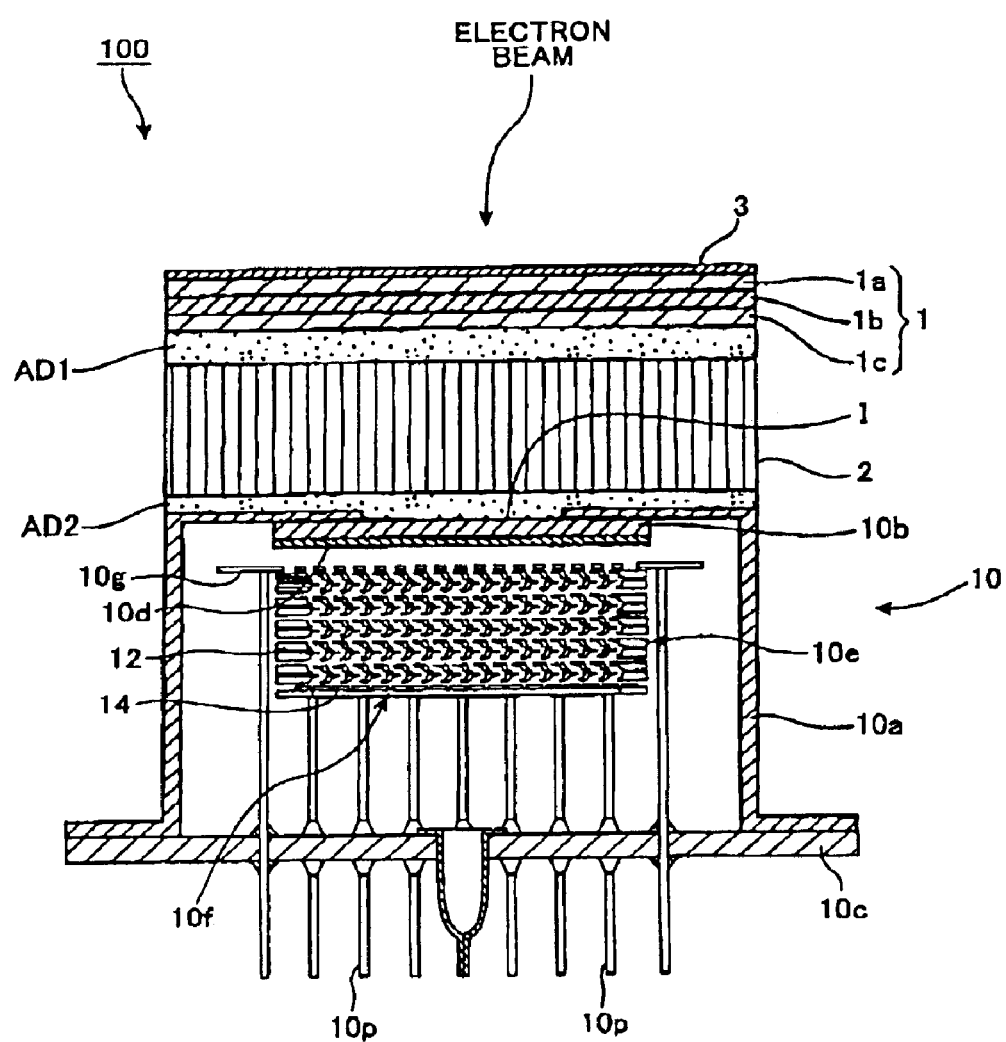
FIG. 9 is a vertical cross-sectional view showing an electron beam detector according to a third embodiment.

FIG. 9 is a vertical cross-sectional view showing the electron beam detector 100 according to a third embodiment. The electron beam detector 100 of the present embodiment differs from that of the first embodiment only in that the adhesive layer AD1 is constructed of a single layer formed of a fluorescent light transmissive adhesive (synthetic resin) rather than two layers. The adhesive layer AD1 having this single-layer construction affixes the compound semiconductor substrate 1 to the light guide 2. With this construction, the compound semiconductor substrate 1 and light guide 2 can be connected with sufficient strength. Further, sufficient good response can be achieved.

Fourth Embodiment

Figure 10:
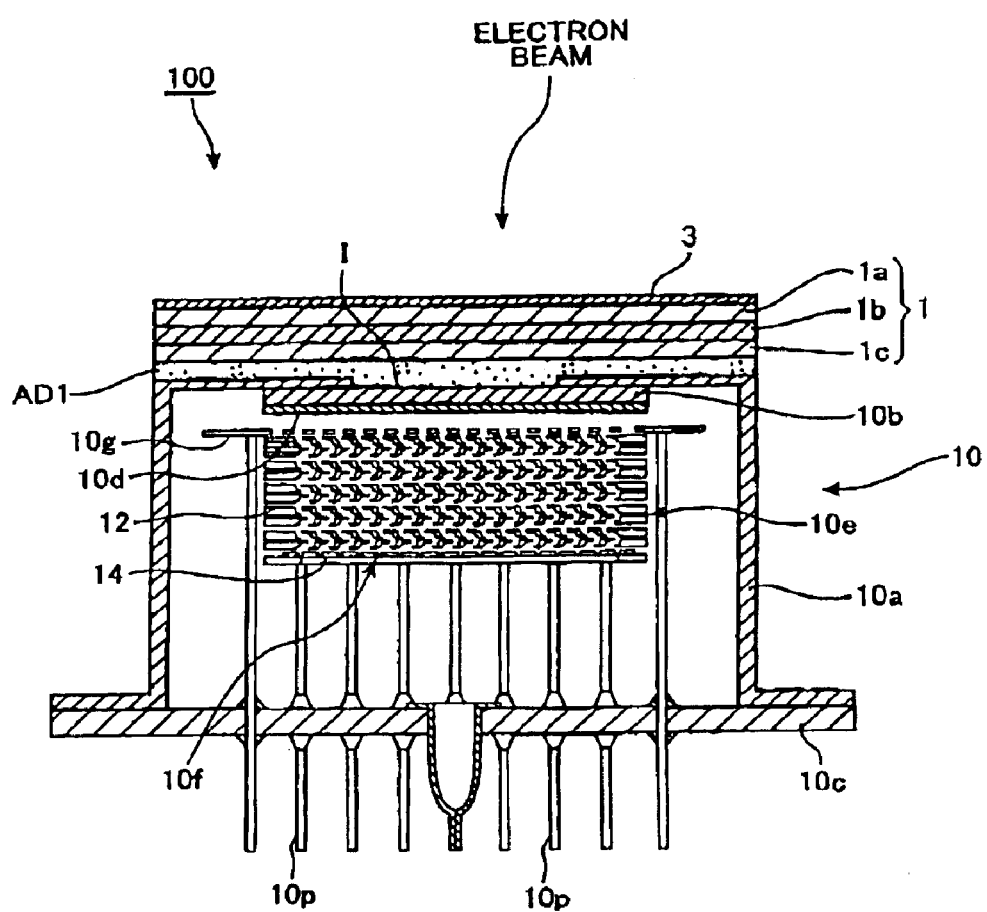
FIG. 10 is a vertical cross-sectional view showing an electron beam detector according to a fourth embodiment.

FIG. 10 is a vertical cross-sectional view showing the electron beam detector 100 according to a fourth embodiment. The electron beam detector 100 of the present embodiment differs from that of the third embodiment only in that the adhesive layer AD1 bonds the compound semiconductor substrate 1 to the photomultiplier tube 10 without the interposing light guide 2 therebetween. With this construction, the compound semiconductor substrate 1 can be connected to the photomultiplier tube 10 with sufficient strength, and sufficient good response can be achieved.

Fifth Embodiment

Figure 11:
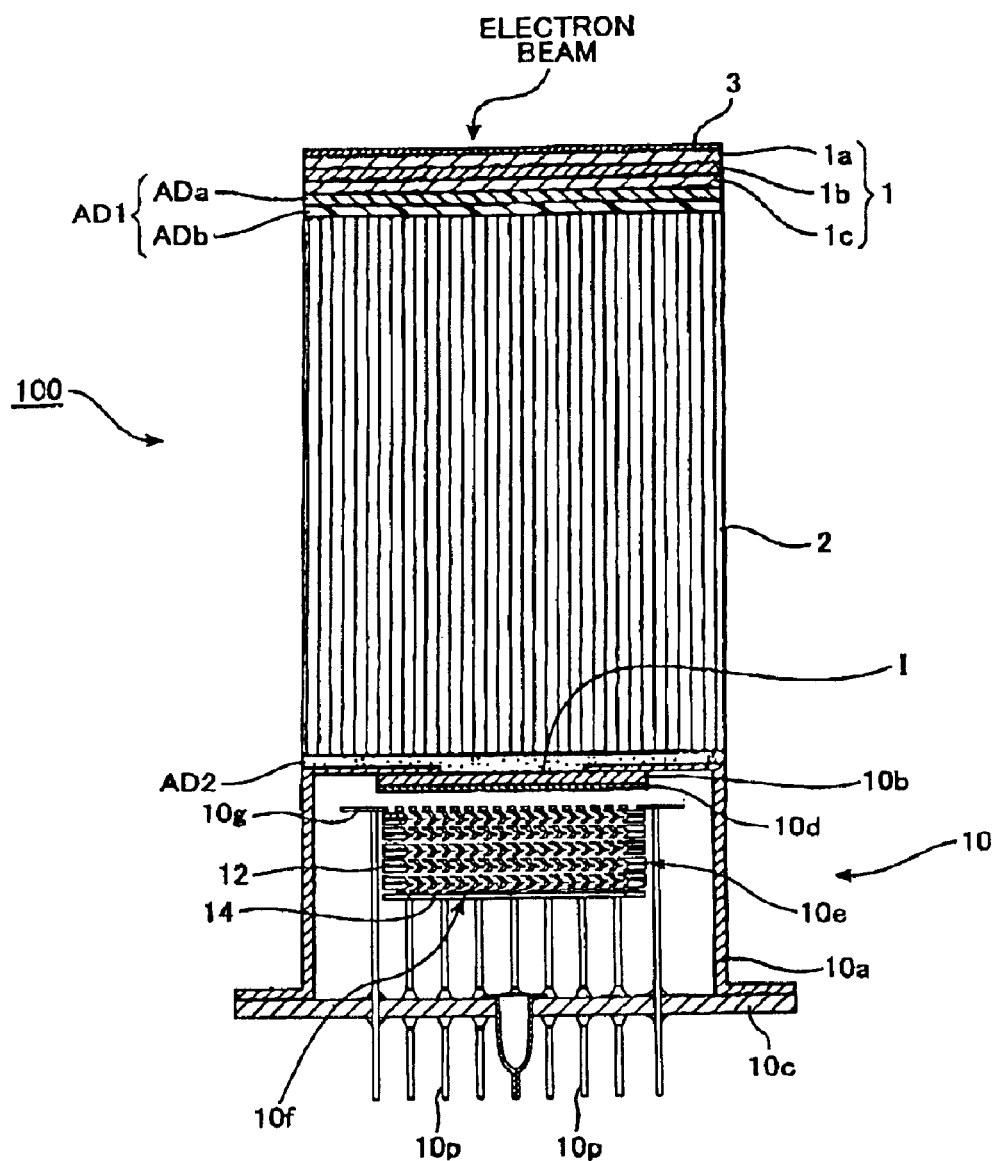
FIG. 11 is a vertical cross-sectional view showing an electron beam detector according to a fifth embodiment.

FIG. 11 is a vertical cross-sectional view showing the electron beam detector 100 according to a fifth embodiment. The electron beam detector 100 of the present embodiment differs from that of the first embodiment only in that the length of the light guide 2 in the direction in which light travels (the axial direction of the electron beam detector 100) in the present embodiment is longer than the length of the photomultiplier tube 10. With this construction, sufficient good response can be achieved.

Sixth Embodiment

Figure 12:
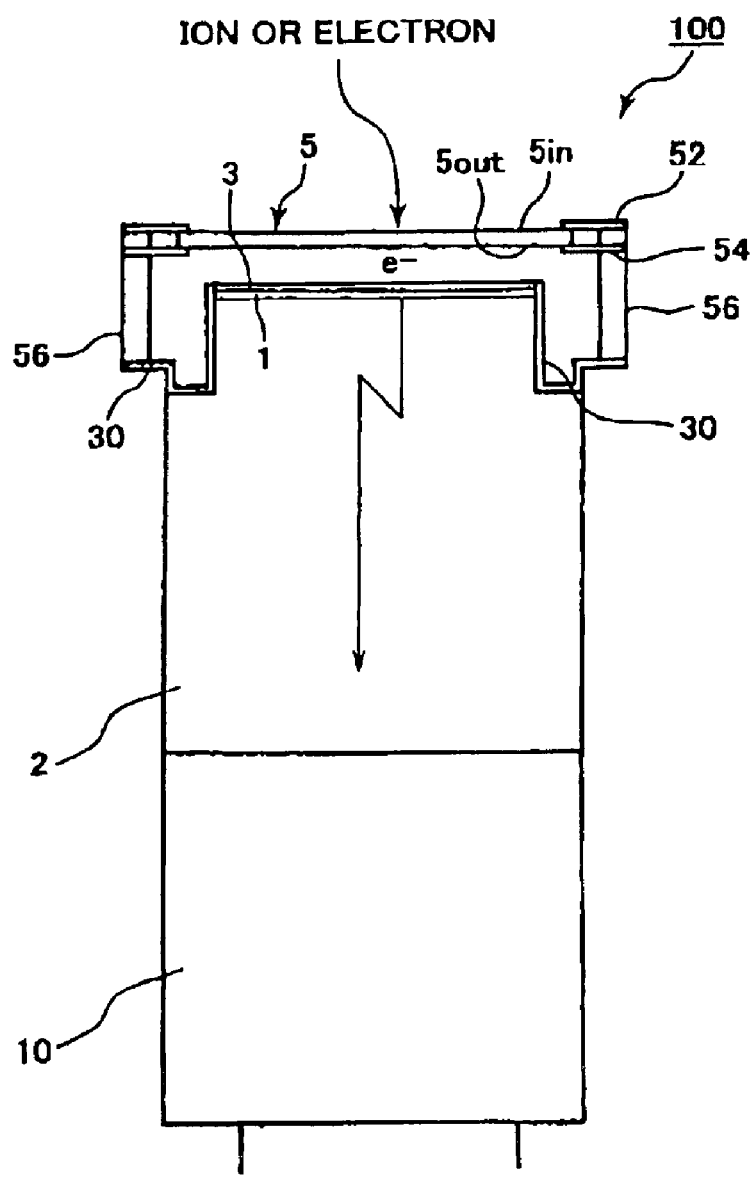
FIG. 12 is a vertical cross-sectional view showing an electron beam detector according to a sixth embodiment.

FIG. 12 is a vertical cross-sectional view showing the electron beam detector 100 according to a sixth embodiment. The electron beam detector 100 of the present embodiment differs from that of the first embodiment only in that a microchannel plate 5 is provided in a position opposing the metal layer 3.

The microchannel plate 5 has a disc-shaped construction formed of a plurality of bundled glass pipes not shown in the drawing, with a secondary electron emitting material formed on the inner walls thereof. The microchannel plate 5 includes an electron incident surface 5in and an electron emitting surface 5out. In the microchannel plate 5 having this construction, the electron emitting surface 5out is disposed in confrontation with the metal layer 3 and separated exactly a predetermined distance therefrom.

Specifically, an incident electrode 52 is formed on the periphery of the electron incident surface 5in of the microchannel plate 5. An emitting electrode 54 is formed on the periphery of the electron emitting surface 5out of the microchannel plate 5. A predetermined voltage is applied across both ends of each glass pipe through the pair of electrodes 52 and 54.

In the present embodiment, a metal layer electrode 30 is formed on the upper periphery of the light guide 2. The metal layer electrode 30 is connected to the metal layer 3. An insulating cylindrical support member 56 is disposed on the upper portion of the electron beam detector 100 in the axial direction to surround the metal layer 3, the compound semiconductor substrate 1, and the upper end of the light guide 2. The bottom portion of the support member 56 is mounted on the end of the metal layer electrode 30, while the upper portion of the support member 56 is mounted on the end of the incident electrode 52 and emitting electrode 54. With this construction, the support member 56 holds the microchannel plate 5 on the light guide 2. By detachably mounting the support member 56 onto the metal layer electrode 30, the microchannel plate 5 can be detachably mounted on the light guide 2.

The electron beam detector 100 in the embodiment having the construction described above operates in the following way.

Voltages are applied to the incident electrode 52, the emitting electrode 54, and the metal layer applying electrode 30 to achieve gradually increasing potentials in the order given and to achieve a suitable potential differential between each component. For example, voltages are applied to these components to achieve a potential difference of 500–900 volts between the electron incident surface 5in and electron emitting surface 5out of the microchannel plate 5 and a potential difference of 5–10 kilovolts between the electron emitting surface 5out and the metal layer 3. When an electron beam travels through the glass pipes via the electron incident surface 5in of the microchannel plate 5, multiplied electrons are emitted from the electron emitting surface 5out. These electrons are attracted to the metal layer 3 due to the potential difference between the electron emitting surface 5out and the metal layer 3 to impinge on the compound semiconductor substrate 1 through the metal layer 3.

This construction can achieve sufficient good response characteristics. Moreover, the electron beam detector of the present embodiment can detect even weak electron beams since the electron beam is multiplied by the microchannel plate 5.

Further, when ions instead of an electron beam are incident on the microchannel plate 5, the microchannel plate 5 can generate and multiply secondary electrons corresponding to the amount of ions. The secondary electrons are converted to fluorescent light in subsequent stages of the compound semiconductor substrate 1, enabling the compound semiconductor substrate 1 to detect ions by detecting fluorescent light in the photomultiplier tube 10. Accordingly, the electron beam detector 100 of the present embodiment can be employed as an ion detector.

In the above description, the microchannel plate 5 is provided in order to multiply electrons, but another electron multiplying device may be provided in place of the microchannel plate 5.

Seventh Embodiment

Figure 13:
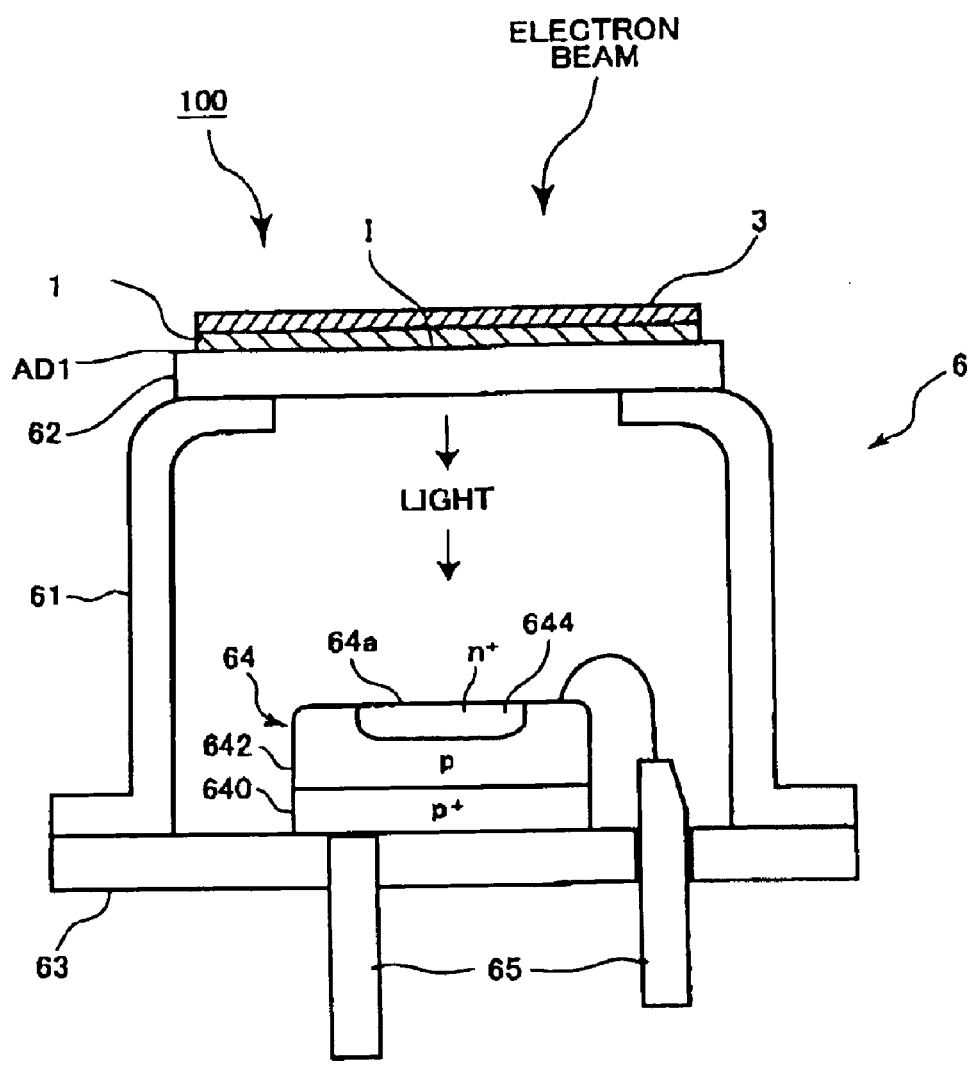
FIG. 13 is a vertical cross-sectional view showing an electron beam detector according to a seventh embodiment.

FIG. 13 is a vertical cross-sectional view showing the electron beam detector 100 according to a seventh embodiment. The electron beam detector 100 of the present embodiment differs from that of the fourth embodiment only in that an avalanche photodiode device 6 is employed as the photodetector of the present embodiment in place of the photomultiplier tube 10.

The avalanche photodiode device 6 includes a container provided with a device package 61, a light incident window (light input faceplate) 62 that seals the opening in the top of the device package 61, and a stem plate 63 that blocks the opening in the bottom of the device package 61. The outer surface of the light incident window 62 provides the light incident surface I. An avalanche photodiode 64 is disposed on the stem plate 63 within the container, such that a light incident surface 64a of the avalanche photodiode 64 opposes the light incident window 62. The avalanche photodiode 64 includes, for example, a $p^+$ layer 640, a p layer 642, and an $n^+$ layer 644. The outer surface of the $n^+$ layer 644 provides the light incident surface 64a. A plurality of pins 65 penetrates the stem plate 63 for applying a reverse bias to the p-n junction in the avalanche photodiode 64. The light incident window 62 is bonded to the compound semiconductor substrate 1 through the adhesive layer AD1.

In the electron beam detector 100 of the present embodiment having the construction described above, fluorescent light is generated when an electron beam is incident on the compound semiconductor substrate 1 through the metal layer 3. The fluorescent light impinges on the avalanche photodiode 64 through the light incident window 62 of the avalanche photodiode device 6, thereby generating electron-hole pairs in the avalanche photodiode 64, which undergo an avalanche multiplication. The avalanche-multiplied output current is extracted externally via the pins 65 as a signal indicating the magnitude of the incident electron beam. Since the avalanche photodiode 64 has sufficiently high response, the electron beam detector 100 of the present embodiment also has sufficiently high response.

The avalanche photodiode 64 of the present embodiment is not limited to the construction described above, but can employ an avalanche photodiode of any type of construction.

As with the present embodiment, the first through third, fifth, and sixth embodiments described above may also employ the avalanche photodiode device 6 in place of the photomultiplier tube 10.

Variation

Since the avalanche photodiode 64 has better response characteristics with a smaller light incident surface 64a, the response drops in an avalanche photodiode 64 having a light incident surface 64a with a large surface area.

Figure 14:
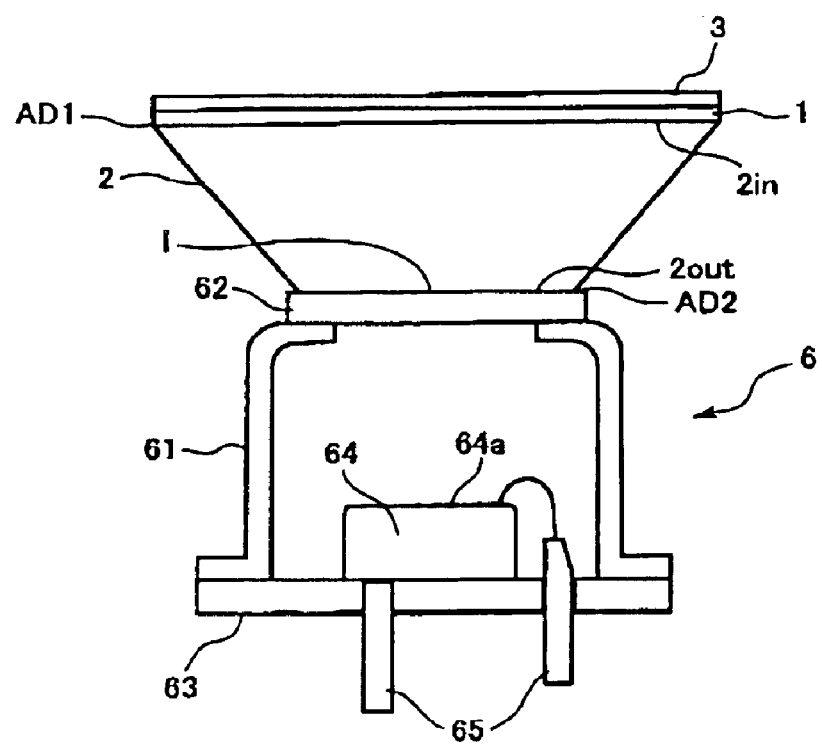
FIG. 14 is a vertical cross-sectional view showing a variation of the electron beam detector according to the seventh embodiment.

Hence, as shown in FIG. 14, it is preferable to use an avalanche photodiode device 6 having a light incident surface 64 with a small surface area and, therefore, a small light incident window 62. In this case, it is preferable to use a compound semiconductor substrate 1 having a considerably smaller surface area than the light incident window 62, wherein the compound semiconductor substrate 1 is connected to the avalanche photodiode device 6 through the light guide 2 that tapers to a reduced fluorescent light output surface. As in the first embodiment, the light guide 2 is bonded to the compound semiconductor substrate 1 and the avalanche photodiode device 6 by the adhesive layer AD1 and the adhesive layer AD2. For example, the light incident window 62 of the avalanche photodiode device 6 has a diameter of about 1 millimeter, while the compound semiconductor substrate 1 has a diameter of about 50 millimeters (two inches). The light guide 2 for connecting the compound semiconductor substrate 1 to the avalanche photodiode device 6 is formed of a conic-shaped glass plate, wherein the surface area of the light output end face 2out is smaller than the surface area of the light input end face 2in. In the present variation, a large amount of electrons incident on the compound semiconductor substrate 1 having a large surface area can be detected at one time while employing the avalanche photodiode device 6 having a small surface area to achieve high response. Accordingly, electrons can be detected with high accuracy.

In the present embodiment and the variation thereof, the light incident window 62 of the avalanche photodiode device 6 having the avalanche photodiode 64 is connected to the compound semiconductor substrate 1. However, the light incident surface 64a of the avalanche photodiode 64 can be connected directly to the compound semiconductor substrate 1 or connected to the compound semiconductor substrate 1 through the light guide 2 without disposing the avalanche photodiode 64 in the device package 61.

The electron beam detector in any of the embodiments described above optically couples a compound semiconductor substrate, from which fluorescent light having a short lifetime is generated in response to an incident electron beam, to a light incident surface of a photodetector, such that the compound semiconductor substrate is integrated with the photodetector. Therefore, the electron beam detector can achieve sufficient good response. Accordingly, the electron beam detector is particularly advantageous in the scanning type electron microscope, mass spectrometer, and ion detector.

The electron beam detector, the scanning type electron microscope, the mass spectrometer, and the ion detector of the present invention is not limited to the embodiments described above. Many modifications and variations may be made therein without departing from the spirit of the invention, the scope of which is defined by the attached claims.

For example, as with the first variation of the first embodiment, any of the third through seventh embodiments can employ a compound semiconductor substrate 1 that is not provided with a coating layer 1a. Alternatively, as with the second variation of the first embodiment, any of the third through seventh embodiments can increase the carrier concentration in at least the surface layer of the light-emitting layer 1b instead of providing the coating layer 1a and the metal layer 3. When the coating layer 1a and the metal layer 3 are not provided in the sixth embodiment described above, the microchannel plate 5 opposes the light-emitting layer 1b. Further, when increasing the carrier concentration of at least the surface layer of the light-emitting layer 1b, the metal layer electrode 30 can be connected to at least the surface of the light-emitting layer 1b.

Further, in any of the third through seventh embodiments described above, the compound semiconductor substrate 1 can include A GaAsP light-emitting layer 1b formed on a AlGaAsP substrate layer 1c, while not including the coating layer 1a, as in the second embodiment. In this case, as in the first variation of the second embodiment, it is possible to not provide the metal layer 3, but to increase the carrier concentration of at least the surface layer of the light-emitting layer 1b. Conversely, as in the second variation of the second embodiment, it is possible to provide the coating layer 1a and the metal layer 3. Further, as in the third variation of the second embodiment, the light-emitting layer 1b can be formed of a compound semiconductor material other than GaAs or GaAsP, such as the compound semiconductor materials (3)–(7) described above.

The compound semiconductor substrate 1 can be formed of a variety of compound semiconductor materials other than those described above. The structure of the compound semiconductor substrate 1 is not limited to the constructions described above. The compound semiconductor substrate 1 can employ any compound semiconductor substrate, provided that the substrate generates fluorescent light in response to incident electron beams. When the coating layer 1a is formed of a material having a variable carrier concentration, the metal layer 3 need not be provided on the coating layer 1a. In this case, the exposed surface of the coating layer 1a provides the electron beam incident surface 1in, and charge-up can be suppressed by adjusting the carrier concentration in the coating layer 1a. The metal layer 3 also need not be provided on the compound semiconductor substrate 1 when all of the coating layer 1a, the light emitting layer 1b, and the substrate layer 1c are manufactured of a material having a variable carrier concentration. In this case, charge-up can be suppressed by adjusting the carrier concentration in the coating layer 1a, the carrier concentrations in the coating layer 1a and light-emitting layer 1b, or the carrier concentrations in all layers 1a–1c, that is, the carrier concentration of the entire compound semiconductor substrate 1.

The present invention is not limited to use of the photomultiplier tube 10 or the avalanche photodiode device 6 as the photodetector. A variety of types of photodetectors may be employed.

A variety of types of light guides in addition to the glass plate that are capable of guiding fluorescent light may be used as the light guide 2. For example, a fiber optic plate (FOP) may be employed as the light guide 2. In the variation of the seventh embodiment, a conic-shaped fiber optic plate may be employed as the light guide 2.

Further, it is possible to use a variety of types of optical members in place of the light guide 2 that are capable of conducting fluorescent light to integrate the compound semiconductor substrate with the photodetector by optically coupling and physically connecting the same. For example, the compound semiconductor substrate can be connected to the photodetector through a lens, such that fluorescent light emitted from the fluorescence emitting surface 1out of the compound semiconductor substrate 1 is converged on the light incident surface I of the photodetector.

Further, the construction of the adhesive layers is not limited to that described above, provided that the adhesive has a fluorescent light transmission and optically couples and physically connects the compound semiconductor substrate to photodetector to integrate the compound semiconductor substrate and the photodetector.

In addition to connecting the compound semiconductor substrate to the photodetector by adhesive or by combination of adhesive and a light guide, a variety of constructions can be used to integrate the compound semiconductor substrate with the photodetector by optically coupling and physically connecting the two.

The electron beam scanning section 220 in the scanning type electron microscope 200 is not limited to an assembly of an electron gun and deflection plates, but can be configured in other ways, provided the electron beam scanning section 220 can scan a sample with an electron beam. Further, the electron beam detector can be disposed at any position in the vacuum chamber that the electron beam detector can receive secondary electrons from the sample A printer or other output device can be connected to the control device 230 in place of the monitor 240. The scanning type electron microscope can be provided with a vacuum chamber that includes at least an electron beam scanning section and an electron beam detector. Such a scanning type electron microscope in combination with a general purpose control device or output device increases the flexibility and ease of use of the device.

The dynode section 340 in the mass spectrometer 300 can be configured with only the first dynode DY1 or the second dynode DY2 according to the sample that is being analyzed. Further, the dynode section 340 can have any construction. For example, the dynode section 340 can be configured of any type of ion-electron converting device that emits electrons in response to incident ions and need not be configured of dynodes. Further, the electron beam detector can be disposed at any position in the vacuum chamber in which the electron beam detector can receive secondary electrons from the dynode. A printer or other output device can be connected to the control device 350 in place of the monitor 360. The mass spectrometer can be configured of a vacuum chamber including at least an ion generating section, a separating section, a dynode section, and an electron beam detector. Such a mass spectrometer in combination with a general purpose control device or an output device increases the flexibility and ease of use of the device.

In the ion detector, any ion-electron converting device for emitting electrons in response to incident ions can be disposed at a position prior to the compound semiconductor substrate for use in place of the microchannel plate.

The electron beam detector of the present invention described above can achieve sufficient good response. The scanning type electron microscope, mass spectrometer, and ion detector of the present invention employing this electron beam detector can perform predetermined operations with high accuracy.

INDUSTRIAL APPLICABILITY

The electron beam detector, the scanning type electron microscope, the mass spectrometer, and the ion detector of the present invention are used in a wide range of applications, including semiconductor inspection and material analysis, for detecting various types of matter, including solids, gases, and ions.

What is claimed is:

1. An electron beam detector comprising:
   a compound semiconductor substrate having an electron beam incident surface and a fluorescence emitting surface, the compound semiconductor substrate converting electrons incident on the electron beam incident surface into fluorescent light to emit the fluorescent light from the fluorescence emitting surface;
   a photodetector; and
   connecting means for optically coupling the fluorescence emitting surface of the compound semiconductor substrate with a light incident surface of the photodetector and physically connecting the compound semiconductor substrate with the photodetector, thereby integrating the compound semiconductor substrate and photodetector,
   wherein the connecting means conducts fluorescent light generated by the compound semiconductor substrate in response to an incident electron beam to the photodetector, and the photodetector detects the fluorescent light.

2. An electron beam detector as recited in claim 1, wherein the compound semiconductor substrate comprises:
   a compound semiconductor substrate layer; and
   a compound semiconductor light emitting layer formed on the compound semiconductor substrate layer through a heterojunction, and formed of a compound semiconductor single crystal for converting an incident electron into fluorescence.

3. An electron beam detector as recited in claim 2, wherein the compound semiconductor light emitting layer is formed of at least one material of the group consisting of GaAs, GaAsP, GaN, GaAlN, GaThN, ZnS, and ZnSe.

4. An electron beam detector as recited in claim 2, wherein the compound semiconductor light emitting layer is formed of a GaAsP layer, and the compound semiconductor substrate layer is formed of an AlGaAsP layer.

5. An electron beam detector as recited in claim 2, wherein the compound semiconductor light emitting layer is formed of a GaAs layer and the compound semiconductor substrate layer is formed of an AlGaAs layer.

6. An electron beam detector as recited in claim 2, wherein the compound semiconductor substrate layer has a fluorescence emitting surface; and the fluorescence emitting surface is connected to the photodetector through the connecting means.

7. An electron beam detector as recited in claim 1, further comprising a metal layer on the electron beam incident surface of the compound semiconductor substrate.

8. An electron beam detector as recited in claim 1, wherein the electron beam incident surface of the compound semiconductor substrate is exposed; and a carrier concentration of the electron beam incident surface is equal to or more than $1 \times 10^{19}$ cm$^{-3}$.

9. An electron beam detector as recited in claim 1, wherein the connecting means is formed of a fluorescent light transmissive adhesive layer.

10. An electron beam detector as recited in claim 1, wherein the connecting means comprises an optical member formed of a fluorescent light transmissive material; the fluorescence emitting surface of the compound semiconductor substrate is mounted on one end face of the optical member, and the other end face of the optical member is mounted on the light incident surface of the photodetector.

11. An electron beam detector as recited in claim 10, wherein the optical member is formed of glass; and the connecting means further includes:
    a SiN layer formed on the fluorescence emitting surface of the compound semiconductor substrate; and
    a SiO$_2$ layer formed on the SiN layer;
    the SiO$_2$ layer being fused to the glass.

12. An electron beam detector as recited in claim 11, wherein the connecting means further comprises a fluorescent light transmissive adhesive layer for fixing the glass to the light incident surface of the photodetector.

13. An electron beam detector as recited in claim 1, further comprising an electron multiplying section disposed at a position facing the electron beam incident surface of the compound semiconductor substrate, wherein an electron beam multiplied by the electron multiplying section is impinged on the electron beam incident surface.

14. An electron beam detector as recited in claim 13, wherein the electron multiplying section is a microchannel plate.

15. An electron beam detector as recited in claim 1, wherein the photodetector is a photomultiplier tube; and the fluorescence emitting surface of the compound semiconductor substrate is connected to a light incident window of the photomultiplier tube through the connecting means.

16. An electron beam detector as recited in claim 15, wherein the photomultiplier tube comprises:
    a wall section forming a vacuum space with the light incident window;
    a photocathode formed in the vacuum space on an inner surface of the light incident window; and
    an electron multiplying section and an anode formed in the vacuum space;
    wherein the photocathode generates electrons in response to incident fluorescence emitted from the compound semiconductor substrate; the electron multiplying section multiplies the electrons; and the anode collects the multiplied electrons.

17. An electron beam detector as recited in claim 16, wherein the electron multiplying section comprises a plurality of stacked dynodes.

18. An electron beam detector as recited in claim 1, wherein the photodetector comprises:
    an avalanche photodiode; and
    the fluorescence emitting surface of the compound semiconductor substrate is connected to the light incident surface of the photodetector through the connecting means.

19. An electron beam detector as recited in claim 18, wherein the light incident surface of the photodetector is smaller than the fluorescence emitting surface of the compound semiconductor substrate; and the connecting means conducting fluorescence to the light incident surface of the photodetector while tapering an output surface thereof.

20. An electron beam detector as recited in claim 19, wherein the connecting means comprises a light guide, the light guide comprising:
    a fluorescence input surface connected to the fluorescence emitting surface of the compound semiconductor substrate; and
    a fluorescence output surface connected to the light incident surface of the photodetector;
    the fluorescence output surface being smaller than the fluorescence input surface.

21. A scanning type electron microscope comprising:
    a wall section constructing a vacuum chamber;
    a electron beam scanning section for scanning a surface of a sample disposed in the vacuum chamber using an electron beam; and
    an electron beam detector including:
        a compound semiconductor substrate having an electron beam incident surface and a fluorescence emitting surface, the compound semiconductor substrate converting electrons incident on the electron beam incident surface into fluorescent light to emit the fluorescent light from the fluorescence emitting surface;
        a photodetector; and
        connecting means for optically coupling the fluorescence emitting surface of the compound semiconductor substrate with a liglit incident surface of the photodetector and physically connecting the compound semiconductor substrate with the photodetector, thereby integrating the compound semiconductor substrate and photodetector;
    wherein the connecting means conducts fluorescent light generated by the compound semiconductor substrate in response to an incident electron beam to the photodetector, and the photodetector detects the fluorescent light;
    wherein the electron beam detector is mounted on the wall section such that at least the electron beam incident surface of the compound semiconductor substrate is positioned within the vacuum chamber;
    the electron scanning section scans the surface of the sample with the electron beam to induce the generation of secondary electrons, and
    an application of a predetermined voltage to the compound semiconductor substrate guides the generated secondary electrons to the electron beam detector, whereby the electron beam detector detects the generated secondary electrons.

22. A scanning type electron microscope as recited in claim 21, further comprising:
    voltage applying means for applying the predetermined voltage to the compound semiconductor substrate in the electron beam detector;
    a control unit; and
    an output unit;
    wherein the voltage applying means applies the predetermined voltage to the compound semiconductor substrate to conduct secondary electrons generated from the sample to the electron beam detector, and the control unit controls the output unit so as to correlate a scanning position of the electron beam with an output from the electron beam detector, thereby outputting an image of the sample.

23. A mass spectrometer comprising:
    a wall section constructing a vacuum chamber;
    an ion generating section disposed within the vacuum chamber for generating ions from a sample;
    a separating section disposed within the vacuum chamber for separating the generated ions in accordance with their masses;
    an ion-electron converting section disposed in the vacuum chamber for generating electrons in response to ions separated by the separating section and impinging thereon; and
    an electron beam detector comprising:
        a compound semiconductor substrate having an electron beam incident surface and a fluorescence emitting surface, the compound semiconductor substrate convening electrons incident on the electron beam incident surface into fluorescent light to emit the fluorescent light from the fluorescence emitting surface;
        a photodetector; and
        connecting means for optically coupling the fluorescence emitting surface of the compound semiconductor substrate with a light incident surface of the photodetector and physically connecting the compound semiconductor substrate with the photodetector, thereby integrating the compound semiconductor substrate and photodetector;
    wherein the connecting means conducts fluorescent light generated by the compound semiconductor substrate in response to an incident electron beam to the photodetector, and the photodetector detects the fluorescent light;
    wherein the electron beam detector is mounted on the wall section such that at least the electron beam incident surface of the compound semiconductor substrate is positioned within the vacuum chamber;

the ion-electron convening section generates secondary electrons in response to ions impinging on the ion-electron convening section, and an application of a predetermined voltage to the compound semiconductor substrate leads the secondary electrons to the electron beam detector, whereby the electron beam detector detects the generated secondary electrons.

24. A scanning type electron microscope as recited in claim 23, further comprising:

voltage applying means for applying the predetermined voltage to the compound semiconductor substrate in the electron beam detector;

a control unit; and an output unit;

wherein the voltage applying means applies the predetermined voltage to the compound semiconductor substrate to conduct secondary electrons generated from the ion-electron converting section to the electron beam detector, and the control unit controls the output unit so as to correlate a separating operation by the separating section with an output from the electron beam detector, thereby outputting a result of mass spectrum.

25. An ion detector comprising:

an electron beam detector having:

a compound semiconductor substrate having an electron beam incident surface and a fluorescence emitting surface, the compound semiconductor substrate converting electrons incident on the electron beam incident surface into fluorescent light to emit the fluorescent light from the fluorescence emitting surface;

a photodetector; and connecting means for optically coupling the fluorescence emitting surface of the compound semiconductor substrate with a light incident surface of the photodetector and physically connecting the compound semiconductor substrate with the photodetector, thereby integrating the compound semiconductor substrate and photodetector; wherein the connecting means conducts fluorescent light generated by the compound semiconductor substrate in response to an incident electron beam to the photodetector, and the photodetector detects the fluorescent light; and a microchannel plate disposed in a position opposite the electron beam incident surface of the compound semiconductor substrate in the electron beam detector;

wherein the microchannel plate generates secondary electrons in response to incident ions, and the generated secondary electrons are guided to the electron beam incident surface of the electron beam detector.

26. An electron beam detector comprising:

a compound semiconductor substrate having an electron beam incident surface and a fluorescence emitting surface, the compound semiconductor substrate converting electrons incident on the electron beam incident surface into fluorescent light to emit the fluorescent light from the fluorescence emitting surface;

a photodetector; and connecting means for optically coupling the fluorescence emitting surface of the compound semiconductor substrate with a light incident surface of the photodetector and physically connecting the compound semiconductor substrate with the photodetector thereby; wherein the connecting means conducts fluorescent light generated from the compound semiconductor substrate in response to an incident electron beam to the photodetector, and the photodetector detects the fluorescent light; wherein the comnound semiconductor substrate comprises:

a comnound semiconductor coating layer; and a compound semiconductor light emitting layer formed on the surface of the compound semiconductor coating layer through a heterojunction and formed of a compound semiconductor single crystal for converting an incident electron beam into fluorescence.

* * * * *